(12) United States Patent
Kuwabara

(10) Patent No.: US 8,658,448 B2
(45) Date of Patent: Feb. 25, 2014

(54) DISPLAY DEVICE AND METHOD FOR MANUFACTURING THE SAME

(75) Inventor: Hideaki Kuwabara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 146 days.

(21) Appl. No.: 13/308,607

(22) Filed: Dec. 1, 2011

(65) Prior Publication Data

US 2012/0146035 A1 Jun. 14, 2012

(30) Foreign Application Priority Data

Dec. 10, 2010 (JP) ................... 2010-275919

(51) Int. Cl.
*H01L 21/00* (2006.01)
(52) U.S. Cl.
USPC ............................. 438/34; 438/158
(58) Field of Classification Search
USPC ....................................................... 438/34
See application file for complete search history.

(56) References Cited

U.S. PATENT DOCUMENTS

| | | | |
|---|---|---|---|
| 5,477,355 A | 12/1995 | Sasaki et al. | |
| 5,731,856 A | 3/1998 | Kim et al. | |
| 5,744,864 A | 4/1998 | Cillessen et al. | |
| 5,886,761 A | 3/1999 | Sasaki et al. | |
| 6,294,274 B1 | 9/2001 | Kawazoe et al. | |
| 6,563,174 B2 | 5/2003 | Kawasaki et al. | |
| 6,727,522 B1 | 4/2004 | Kawasaki et al. | |
| 6,869,833 B1 * | 3/2005 | Chen | 438/158 |
| 7,005,331 B2 * | 2/2006 | Chen | 438/158 |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Lex Malsawma
(74) *Attorney, Agent, or Firm* — Fish & Richardson P.C.

(57) ABSTRACT

A conductive layer to be a gate electrode, an insulating layer to be a gate insulating layer, a semiconductor layer, and an insulating layer to be a channel protective layer, which are each included in a transistor, are successively formed without exposure to the air. A gate electrode (including another electrode or a wiring which is formed in the same layer) and an island-like semiconductor layer are formed through one photolithography step. A display device is manufactured through four photolithography steps including the photolithography step, a photolithography step of forming a contact hole, a photolithography step of forming a source electrode and a drain electrode (including another electrode or a wiring which is formed in the same layer), and a photolithography step of forming a pixel electrode (including another electrode or a wiring which are formed in the same layer).

10 Claims, 13 Drawing Sheets

(56) References Cited

U.S. PATENT DOCUMENTS

| | | | |
|---|---|---|---|
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,420,420 B2 * | 4/2013 | Yen et al. ................. 438/34 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0140259 A1 * | 6/2009 | Yamazaki ................. 257/67 |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0187535 A1 * | 7/2010 | Suzawa et al. .................. 257/66 |
| 2011/0024740 A1 | 2/2011 | Yamazaki et al. |
| 2011/0024750 A1 | 2/2011 | Yamazaki et al. |
| 2011/0024751 A1 | 2/2011 | Yamazaki et al. |
| 2011/0031491 A1 | 2/2011 | Yamazaki et al. |
| 2011/0037068 A1 | 2/2011 | Yamazaki et al. |
| 2012/0061665 A1 | 3/2012 | Miyake et al. |

FOREIGN PATENT DOCUMENTS

| | | |
|---|---|---|
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-203987 A | 8/1993 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| WO | 2004/114391 A1 | 12/2004 |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: AL and SN-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer technology," IEDM 05: Technical Digest of international eletron devices meeting, Dec. 5, 2005, pp. 1067-1069.

Fortunato, E et al., "Wide-Bandgap High-Mobility ZNO Thin-Film Transistors Produced at Room temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT,"SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT,"AM-FPD '09 Digest of Technical Papers, Jul. 1, 2009, pp. 41-44.

Hayashi, R et al., "42.1: Invited Paper: Improved Amorphous In-Ga-Zn-O TFTS,"SID Digest '08 : SID International Symposium Digest of Technical Papers, May 20, 2008, vol. 39, pp. 621-624.

Hirao, T et al.. "Novel Top-Gate Zinc Oxide Thin-Film Transistors (ZNO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancles In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties, SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3-A2O3-BO Systems [A; Fe, Ga, Or Al; B: Mg, Mn, F, Ni, Cu,Or Zn] at Temperatures over 1000° C," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGaO4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using Igzo Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

LI, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6TH International Display Workshops, Dec. 3, 2008, pp. 581-584.

Nakamura, "Synthesis of Homologous Compound with New Long-Period Structure," Nirim Newsletter, Mar. 1995, vol. 150, pp. 1-4 with English translation.

Nakamura, M et al., "The phase relations in the In2O3-Ga2ZnO4-ZnO system at 1350° C," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem Oleds," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZNO Thin-Film Transistors With Aluminum Oxide Dielectric Layers," J. Electrochem. Soc. (Journal of the Electrochemical Society), 2008, vol. 155, No. 12, pp. H1009-H1014.

(56) References Cited

OTHER PUBLICATIONS

Ohara, H et al., "21.3: 4.0 In. QVGA AMOLED Display Using In-Ga-Zn-Oxide TFTS With a Novel Passivation Layer," SID Digest '09 : SID International Symposium Digest of Technical Papers, May 31, 2009, pp. 284-287.

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al.. "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED" AM-FPD '08 Digest of Technical Papers, Jul. 2, 2008, pp. 275-278.

Park, S et al., "Challenge to Future Displays: Transparent AM-OLED Driven by Peald Grown ZNO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous. In-Ga-Zn-Oxide TFTS,"IDW '09 : Proceedings of the 16th International Display Workshops, 2009, pp. 689-692.

Son, K et al., "42.4L: Late-News Paper: 4 Inch QVGA AMOLED Driven by the Threshold voltage controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of Igzo Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9TH International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

FIG. 5A1
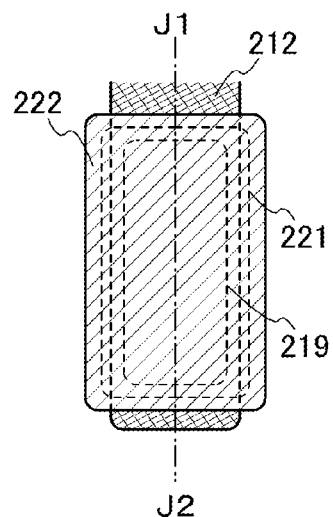
FIG. 5A2
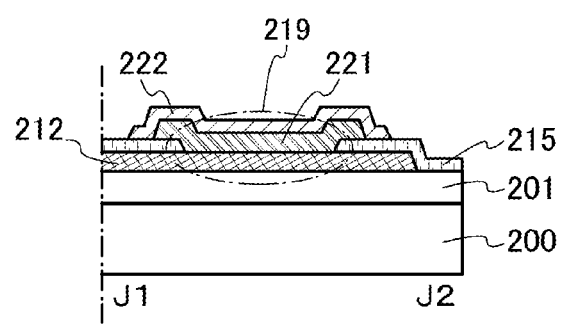
FIG. 5B1
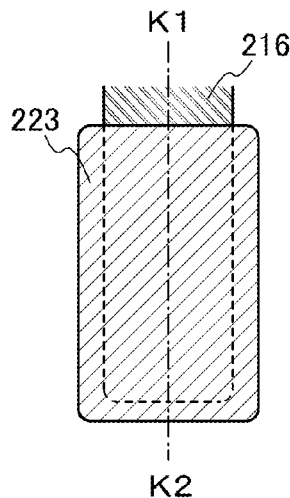
FIG. 5B2
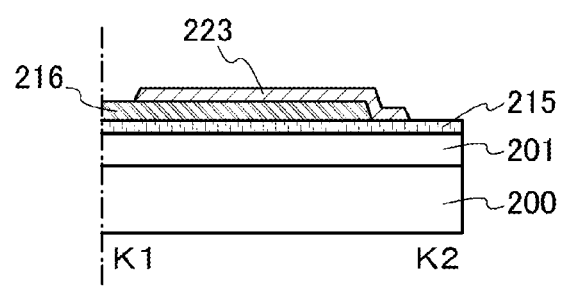

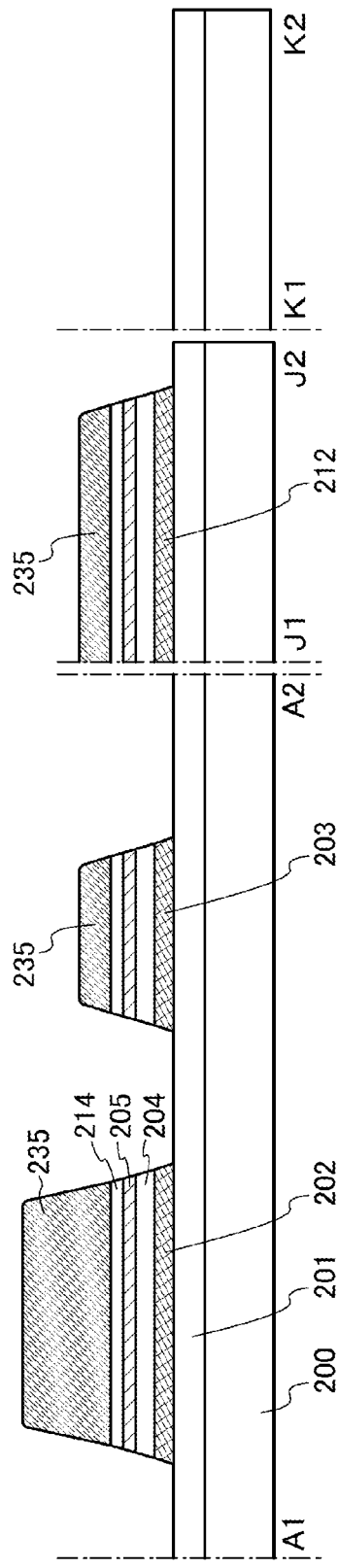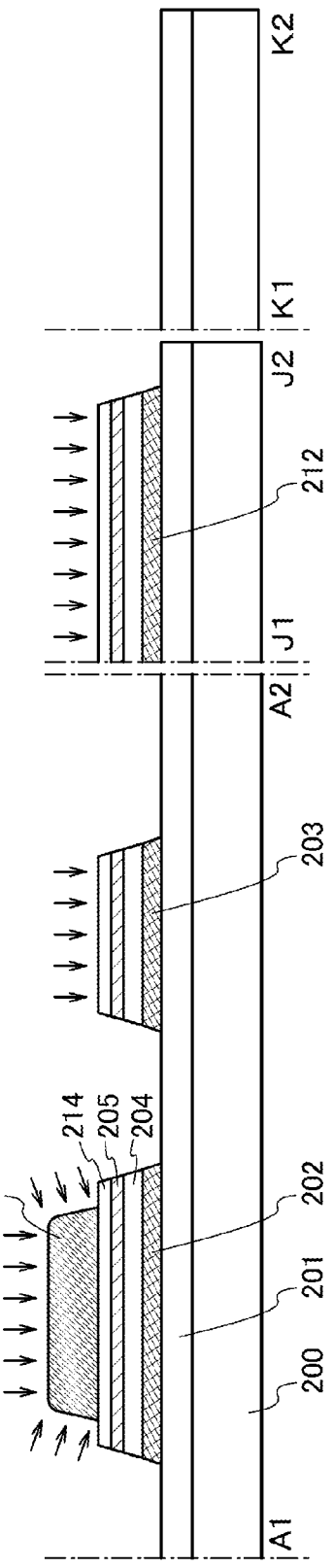

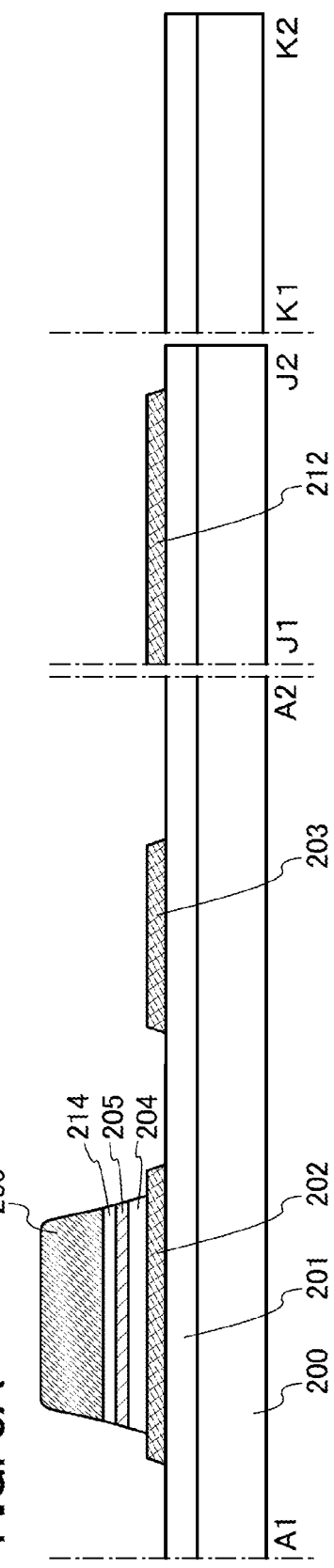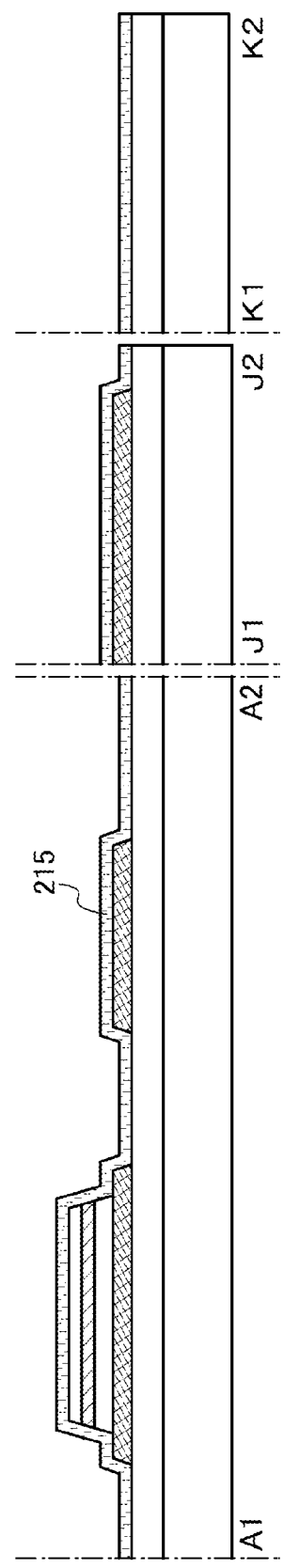

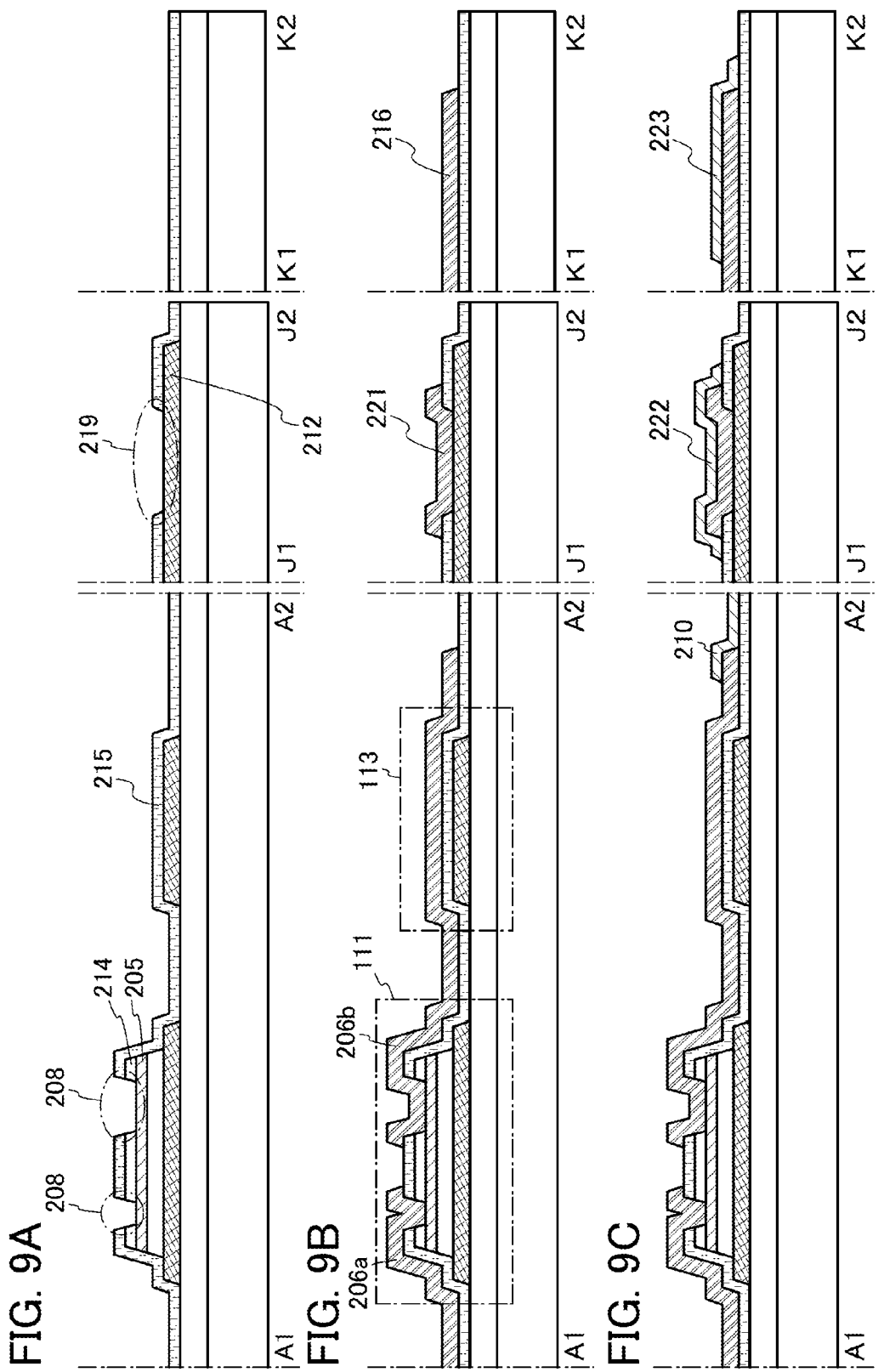

DISPLAY DEVICE AND METHOD FOR MANUFACTURING THE SAME

BACKGROUND OF THE INVENTION

1. Field of the Invention

The present invention relates to a semiconductor device and a method for manufacturing the semiconductor device, and a display device and a method for manufacturing method the display device.

In this specification, a semiconductor device means all types of devices which can function by utilizing semiconductor characteristics, and a semiconductor circuit, a memory device, an imaging device, a display device, an electro-optical device, an electronic appliance, and the like are all semiconductor devices.

2. Description of the Related Art

In recent years, transistors that are formed using a semiconductor thin film having a thickness of several nanometers to several hundreds of nanometers over a substrate having an insulating surface such as a glass substrate have been attracting attentions. Transistors are widely used for electronic devices such as integrated circuits (ICs) and electro-optical devices. In particular, transistors are urgently developed as switching elements of display devices typified by liquid crystal display devices and the like. In an active matrix liquid crystal display device, a voltage is applied between a pixel electrode connected to a selected switching element and an opposite electrode corresponding to the pixel electrode, and thus, a liquid crystal layer disposed between the pixel electrode and the opposite electrode is modulated optically. The optical modulation can be recognized as a display pattern by an observer. An active matrix liquid crystal display device here means a liquid crystal display device which employs a method in which a display pattern is formed on a screen by driving pixel electrodes arranged in matrix using switching elements.

The range of uses of such an active matrix liquid crystal display device is expanding, and demands for larger screen size, higher definition, and higher aperture ratio are increasing. In addition, it is demanded that the active matrix liquid crystal display device have high reliability and that a production method of the active matrix liquid crystal display device offer high yield and reduce production cost. Simplification of a process is one way for increasing productivity and reducing manufacturing cost.

In active matrix liquid crystal display devices, transistors are mainly used as switching elements. In manufacturing transistors, reduction in the number of photolithography steps or simplification of the photolithography step is important for simplification of the whole process. For example, when one photolithography step is added, the following steps are further needed: resist application, prebaking, light exposure, development, post-baking, and the like and, moreover, steps before and after the aforementioned steps, such as film formation, etching, resist removal, cleaning, and drying. The number of steps is significantly increased only by adding one photolithography step in the manufacturing process. Therefore, many techniques for reducing the number of photolithography steps or simplifying the photolithography step in a manufacturing process have been developed.

Transistors are broadly classified into top-gate transistors, in which a channel formation region is provided below a gate electrode, and bottom-gate transistors, in which a channel formation region is provided above a gate electrode. These transistors are generally manufactured using at least five photomasks.

Many conventional techniques for simplifying the photolithography step use a complicated technique such as backside light exposure (e.g., Patent Document 1), resist reflow, or a lift-off method, which requires a special apparatus in many cases. Using such complicated techniques may cause various problems, thereby leading to reduction in yield. Moreover, electric characteristics of transistors are often deteriorated.

REFERENCE

[Patent Document 1] Japanese Published Patent Application No. H05-203987

SUMMARY OF THE INVENTION

An object of one embodiment of the present invention is to reduce the number of photolithography steps used for manufacturing a transistor to less than the conventional one.

Another object of one embodiment of the present invention is to reduce the number of photomasks used for manufacturing a display device including a transistor to less than the conventional one.

Another object of one embodiment of the present invention is to provide a transistor with high productivity.

Another object of one embodiment of the present invention is to provide a display device with high productivity.

Another object of one embodiment of the present invention is to provide a display device with low power consumption.

Another object of one embodiment of the present invention is to provide a display device with high reliability.

A step of forming a gate electrode (including another electrode or a wiring which is formed in the same layer) and a step of forming an island-like semiconductor layer are performed through one photolithography step, whereby a semiconductor device can be manufactured with the number of photomasks and the number of photolithography steps reduced to less than the conventional one.

A conductive layer to be a gate electrode, an insulating layer to be a gate insulating layer, a semiconductor layer, and an insulating layer to be a channel protective layer, which are each included in a transistor, are successively formed without exposure to the air, whereby each of layers and interfaces thereof are prevented from being contaminated and thus the characteristics and the reliability of a semiconductor device can be improved.

A semiconductor device is manufactured through four photolithography steps including a photolithography step which serves as both a step of forming a gate electrode (including another electrode or a wiring which is formed in the same layer) and a step of forming an island-like semiconductor layer, a step of forming a contact hole, a step of forming a source electrode and a drain electrode (including another electrode or a wiring which is formed in the same layer), and a step of forming a pixel electrode (including another electrode or a wiring which is formed in the same layer).

A conductive layer to be a gate electrode, an insulating layer to be a gate insulating layer, a semiconductor layer, and an insulating layer to be a channel protective layer, which are each included in a transistor, are successively formed, and a resist mask having a thick region and a thin region, which is exposed to light and developed using a multi-tone mask as a first photomask, is formed.

The conductive layer to be a gate electrode, the insulating layer to be a gate insulating layer, the semiconductor layer, and the insulating layer to be a channel protective layer are etched using the resist mask as a mask. Subsequently, the thin region of the resist mask is removed so that a remaining conductive layer to be a gate electrode, a remaining insulating layer to be a gate insulating layer, a remaining semiconductor layer, and a remaining insulating layer to be a channel protective layer are exposed. Further, the insulating layer to be a gate insulating layer, the semiconductor layer, and the insulating layer to be a channel protective layer are etched using the remaining resist mask as a mask so that a gate electrode (including another electrode or a wiring which is formed in the same layer), an island-like gate insulating layer, an island-like semiconductor layer, and island-like channel protective layer are formed. After that, the resist mask is removed.

In such a manner, the gate electrode (including another electrode or a wiring which is formed in the same layer) and the island-like semiconductor layer can be formed through one photolithography step. At this time, the side surfaces of the island-like gate insulating layer, the island-like semiconductor layer, and the island-like channel protective layer on each side are substantially aligned with one another, and each layer has a substantially similar shape when seen from the above.

In this specification, "layers in which the side surfaces on one side are substantially aligned with one another" means that outlines of the side surfaces of the layers on one side are substantially aligned as seen from the above, including the case where upper end portions and lower end portions of the layers are aligned, the case where the side surface of one layer is recessed with respect to the side surface of another layer, and the case where tapered shapes of the side surfaces on one side of the layers are different from one another.

Further, the end portions of the gate electrode are projected from the end portions of the island-like gate insulating layer, the island-like semiconductor layer, and the island-like channel protective layer, whereby a step is suppressed and coverage with an insulating layer or a conductive layer which will be formed later can be improved.

According to one embodiment of the present invention, a display device includes a gate electrode, a gate insulating layer, a semiconductor layer, a channel protective layer, a source electrode, and a drain electrode. In the display device, the source electrode and the drain electrode are electrically connected to the semiconductor layer through contact holes provided in the channel protective layer; the drain electrode is electrically connected to a pixel electrode; and side surfaces of the gate insulating layer, the semiconductor layer, and the channel protective layer on one side are substantially aligned with one another.

According to another embodiment of the present invention, a display device includes a transistor and a capacitor. In the display device, the transistor includes a gate insulating layer formed over a gate electrode; a semiconductor layer formed over the gate insulating layer; a first channel protective layer formed over the semiconductor layer; a second channel protective layer formed over the first channel protective layer; and a source electrode and a drain electrode formed over the second channel protective layer and electrically connected to the semiconductor layer through contact holes provided in the first channel protective layer and the second channel protective layer. The drain electrode is electrically connected to a pixel electrode; and side surfaces of the gate insulating layer, the semiconductor layer, and the first channel protective layer of the transistor on one side are substantially aligned with one another; and in the capacitor, the second channel protective layer is interposed between a capacitor wiring and the drain electrode.

According to another embodiment of the present invention, in a method for manufacturing a display device, a conductive layer, a first insulating layer, a semiconductor layer, and a second insulating layer are formed; a gate electrode and an island-like semiconductor layer are formed by selective removal of the conductive layer, the first insulating layer, the semiconductor layer, and the second insulating layer through a first photolithography step; a portion of the island-like semiconductor layer is exposed by selective removal of a portion of the second insulating layer through a second photolithography step; a source electrode and a drain electrode are formed through a third photolithography step; and a pixel electrode is formed through a fourth photolithography step.

According to another embodiment of the present invention, in a method for manufacturing a display device, a conductive layer, a first insulating layer, a semiconductor layer, and a second insulating layer are formed; a gate electrode, a capacitor wiring, and an island-like semiconductor layer are formed by selective removal of the conductive layer, the first insulating layer, the semiconductor layer, and the second insulating layer through a first photolithography step; a third insulating layer covering the gate electrode, the capacitor wiring, and the island-like semiconductor layer are formed; a portion of the island-like semiconductor layer is exposed by selective removal of a portion of the second insulating layer and the third insulating layer through a second photolithography step; a source electrode and a drain electrode are formed through a third photolithography step and a portion of the drain electrode overlaps with the third insulating layer and the capacitor wiring; and a pixel electrode is formed through a fourth photolithography step.

The removal of the conductive layer, the first insulating layer, the semiconductor layer, the second insulating layer, and the third insulating layer can be performed by dry etching, wet etching, or a combination of dry etching and wet etching.

When the gate electrodes, the source electrodes, the drain electrodes, or a wiring connected to such electrodes are formed of a material containing copper or aluminum, wiring resistance can be reduced and thus signal delay can be prevented.

For the semiconductor layer, a single crystal semiconductor, a polycrystalline semiconductor, a microcrystalline semiconductor, an amorphous semiconductor, or the like can be used. Examples of a semiconductor material include silicon, germanium, silicon germanium, silicon carbide, and gallium arsenide.

Alternatively, an oxide semiconductor can be used for the semiconductor layer. The electron affinity of an oxide semiconductor is higher than that of silicon or germanium, and an ohmic contact between the semiconductor layer, and the source electrode or the drain electrode can be obtained without an ohmic contact layer therebetween. With the use of an oxide semiconductor for the semiconductor layer, a manufacturing process of a semiconductor device can be simplified; thus, the productivity of the semiconductor device can be improved.

Note that an oxide semiconductor which is purified (purified OS) by reduction of an impurity such as moisture or hydrogen which serves as an electron donor (donor) can be made to be an i-type (intrinsic) oxide semiconductor or an oxide semiconductor extremely close to an i-type semiconductor (a substantially i-type oxide semiconductor) by then supplying oxygen to the oxide semiconductor to reduce oxygen deficiency in the oxide semiconductor. Accordingly, a transistor including the i-type or substantially i-type oxide semiconductor in a semiconductor layer where a channel is formed has characteristics of very small off-state current. Specifically, the concentration of hydrogen in the purified oxide semiconductor which is measured by secondary ion mass spectrometry (SIMS) is lower than or equal to $5\times10^{19}/cm^3$, preferably lower than or equal to $5\times10^{18}/cm^3$, further preferably lower than or equal to $5\times10^{17}/cm^3$, still further preferably lower than or equal to $1\times10^{16}/cm^3$. In addition, the carrier density of the oxide semiconductor layer, which is measured by Hall effect measurement, is lower than $1\times10^{14}/cm^3$, preferably lower than $1\times10^{12}/cm^3$, further preferably lower than $1\times10^{11}/cm^3$. Furthermore, the band gap of the oxide semiconductor is 2 eV or more, preferably 2.5 eV or more, further preferably 3 eV or more. When the oxide semiconductor which is purified by reduction of an impurity such as moisture or hydrogen and in which oxygen deficiency is reduced is used for the semiconductor layer, the off-state current of the transistor can be reduced.

The analysis of the hydrogen concentration in the oxide semiconductor by SIMS is described here. It is known to be difficult to obtain accurate data in the proximity of a surface of a sample or in the proximity of an interface between stacked films formed of different materials by the SIMS analysis in principle. Thus, in the case where the distribution of the hydrogen concentration in the thickness direction of a film is analyzed by SIMS, the average value of the hydrogen concentration in a region of the film where almost the same value can be obtained without significant variation is employed as the hydrogen concentration. Further, in the case where the thickness of the film is small, a region where almost the same value can be obtained cannot be found in some cases due to the influence of the hydrogen concentration of an adjacent film. In this case, the maximum value or the minimum value of the hydrogen concentration of a region where the film is provided is employed as the hydrogen concentration of the film. Furthermore, in the case where a maximum value peak and a minimum value valley do not exist in the region where the film is provided, the value of the inflection point is employed as the hydrogen concentration.

According to one embodiment of the present invention, the number of manufacturing steps of a display device can be reduced; accordingly, a transistor can be provided at low cost with high productivity.

According to one embodiment of the present invention, the number of manufacturing steps of a display device can be reduced; accordingly, a display device can be provided at low cost with high productivity.

According to one embodiment of the present invention, a display device with low power consumption can be provided.

According to one embodiment of the present invention, a display device with high reliability can be provided.

One embodiment of the present invention solves at least one of the above problems.

BRIEF DESCRIPTION OF THE DRAWINGS

FIGS. 5A1 and 5B1 and FIGS. 5A2 and 5B2 are top views and cross-sectional views, respectively, illustrating one embodiment of the present invention.

FIGS. 7A and 7B are cross-sectional views illustrating one embodiment of the present invention.

FIGS. 8A and 8B are cross-sectional views illustrating one embodiment of the present invention.

FIGS. 9A to 9C are cross-sectional views illustrating one embodiment of the present invention.

DETAILED DESCRIPTION OF THE INVENTION

Figure 1A:
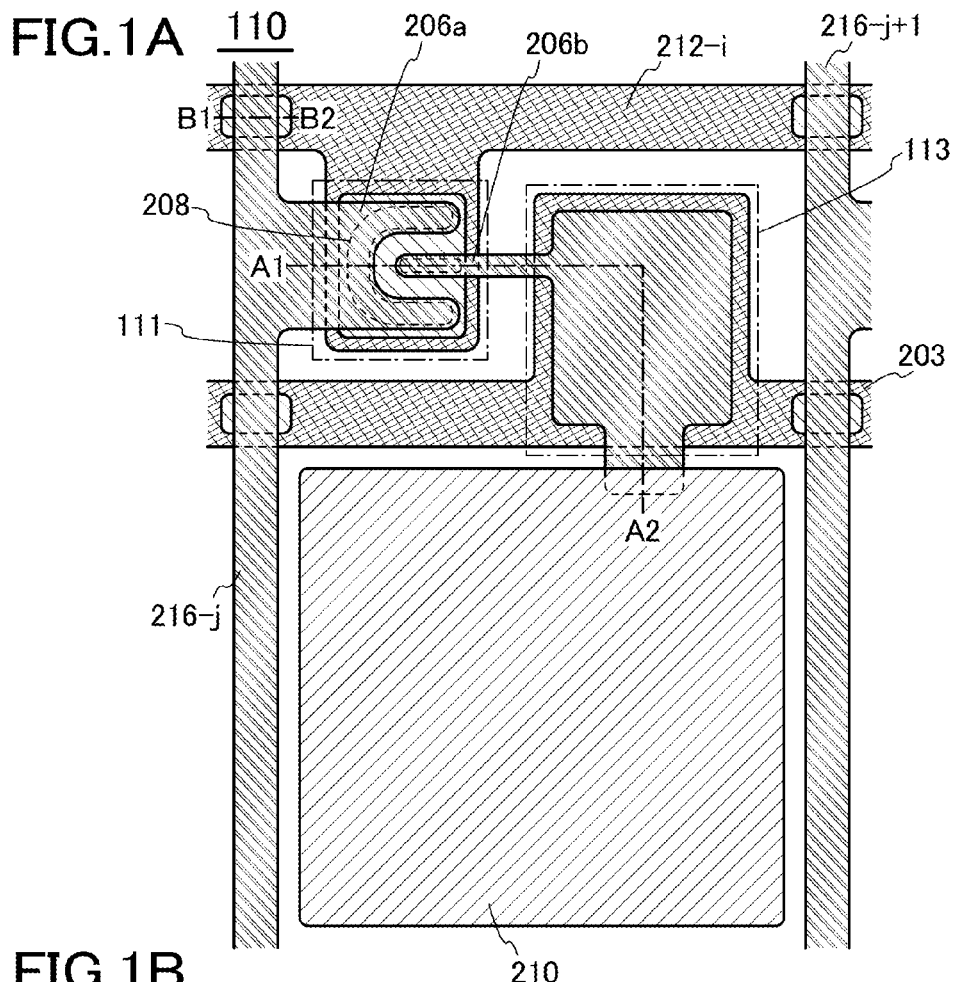
FIGS. 1A to 1C are a top view and cross-sectional views illustrating one embodiment of the present invention.

Embodiments will be described in detail with reference to the drawings. Note that the present invention is not limited to the following description, and it will be readily appreciated by those skilled in the art that the mode and details can be changed in various different ways without departing from the spirit and the scope of the present invention. Therefore, the present invention should not be construed as being limited to the following description of the embodiments. Note that in the structures of the present invention which are described below, the same reference numerals are commonly used to denote the same components or components having similar functions among different drawings, and description of such components is not repeated.

In addition, in this specification and the like, ordinal numbers such as "first", "second", and "third" are used in order to avoid confusion among components, and the terms do not limit the components numerically.

In addition, the position, size, range, or the like of each structure illustrated in drawings and the like is not accurately represented in some cases for easy understanding. Therefore, the disclosed invention is not necessarily limited to the position, size, range, or the like as disclosed in the drawings and the like.

A transistor is one kind of semiconductor elements and can amplify current or voltage and perform a switching operation for controlling conduction or non-conduction, for example. A transistor in this specification includes an insulated-gate field effect transistor (IGFET) and a thin film transistor (TFT).

Functions of a "source" and a "drain" of a transistor might interchange when a transistor of opposite polarity is used or the direction of current flow is changed in circuit operation, for example. Therefore, the terms "source" and "drain" can be used to denote the drain and the source, respectively, in this specification.

In addition, in this specification and the like, the term such as "electrode" or "wiring" does not limit a function of a component. For example, an "electrode" is sometimes used as part of a "wiring", and vice versa. Further, the term "electrode" or "wiring" can also mean a combination of a plurality of "electrodes" and "wirings" formed in an integrated manner.

Embodiment 1

In this embodiment, examples of a pixel of a display device formed through a process in which the number of photomasks and the number of photolithography steps are reduced, and an example of a method for forming the pixel will be described with reference to FIGS. 1A to 1C, FIGS. 2A and 2B, FIGS.

3A and 3B, FIGS. 4A and 4B, FIGS. 5A1, 5A2, 5B1, and 5B2, FIGS. 6A and 6B, FIGS. 7A and 7B, FIGS. 8A and 8B, and FIGS. 9A to 9C.

Figure 4A:
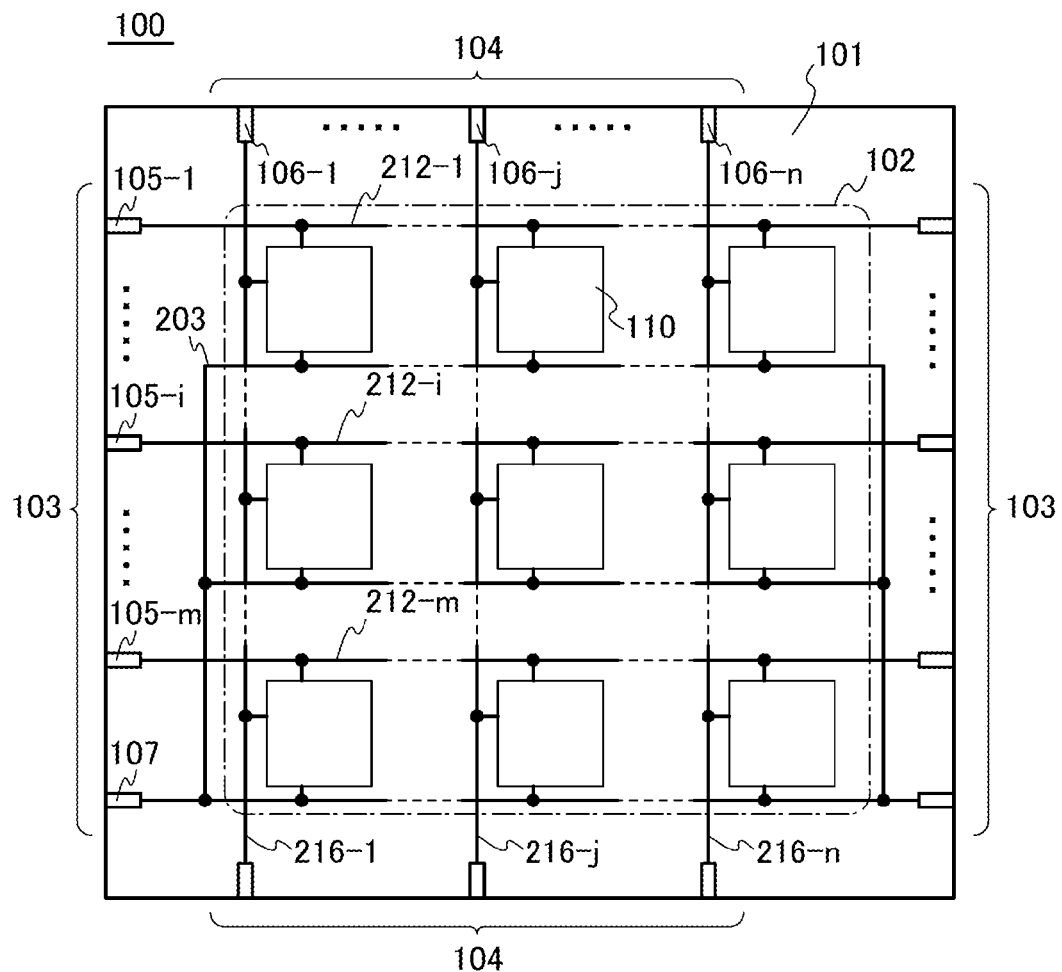
FIGS. 4A and 4B are circuit diagrams illustrating one embodiment of the present invention.

FIG. 4A illustrates an example of the configuration of a semiconductor device 100 that is used in a display device. The semiconductor device 100 includes a pixel region 102, a terminal portion 103 including m terminals 105 (105-1 to 105-m and m is an integer of greater than or equal to 1) and a terminal 107, and a terminal portion 104 including n terminals 106 (106-1 to 106-n and n is an integer of greater than or equal to 1) over a substrate 101. Further, the semiconductor device 100 includes m wirings 212 electrically connected to the terminal portion 103, n wirings 216 electrically connected to the terminal portion 104, and a wiring 203. The pixel region 102 includes a plurality of pixels 110 arranged in matrix of m rows (in the longitudinal direction)×n columns (in the transverse direction). The pixel 110 (i, j) (i is an integer greater than or equal to 1 and less than or equal to m, and j is an integer greater than or equal to 1 and less than or equal to n) in the i-th row and the j-th column is electrically connected to a wiring 212-i and a wiring 216-j. In addition, each pixel is connected to the wiring 203 functioning as a capacitor electrode or a capacitor wiring, and the wiring 203 is electrically connected to the terminal 107. The wiring 212-i is electrically connected to a terminal 105-i, and the wiring 216-j is electrically connected to a terminal 106-j.

The terminal portion 103 and the terminal portion 104 are external input terminals and are connected to external control circuits with flexible printed circuits (FPC) or the like. Signals supplied from the external control circuits are input to the semiconductor device 100 through the terminal portion 103 and the terminal portion 104. In FIG. 4A, such terminal portions 103 are provided on the right and left of the pixel region 102, so that signals are input from two directions. Further, such terminal portions 104 are provided above and below the pixel region 102, so that signals are input from two directions. By inputting signals from two directions, signal supply capability is increased and high-speed operation of the semiconductor device 100 is facilitated. In addition, influences of signal delay due to an increase in size of the semiconductor device 100 or an increase in wiring resistance accompanied by an increase in definition can be reduced. Moreover, the semiconductor device 100 can have redundancy, so that the reliability of the semiconductor device 100 can be improved. Although two terminal portions 103 and two terminal portions 104 are provided in FIG. 4A, a structure in which one terminal portion 103 and one terminal portion 104 are provided may also be employed.

Figure 4B:
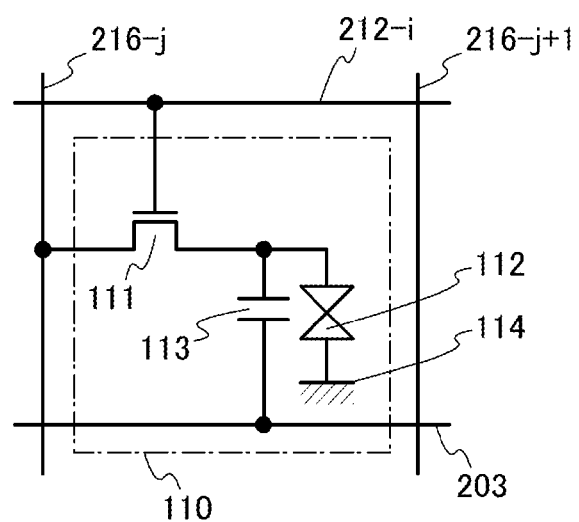
Figure 6A:
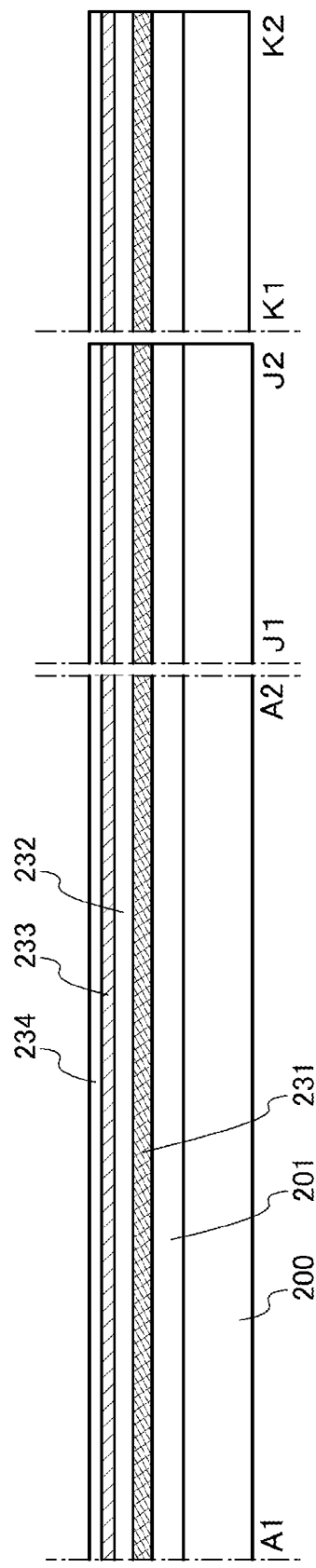
FIGS. 6A and 6B are cross-sectional views illustrating one embodiment of the present invention.
Figure 6B:
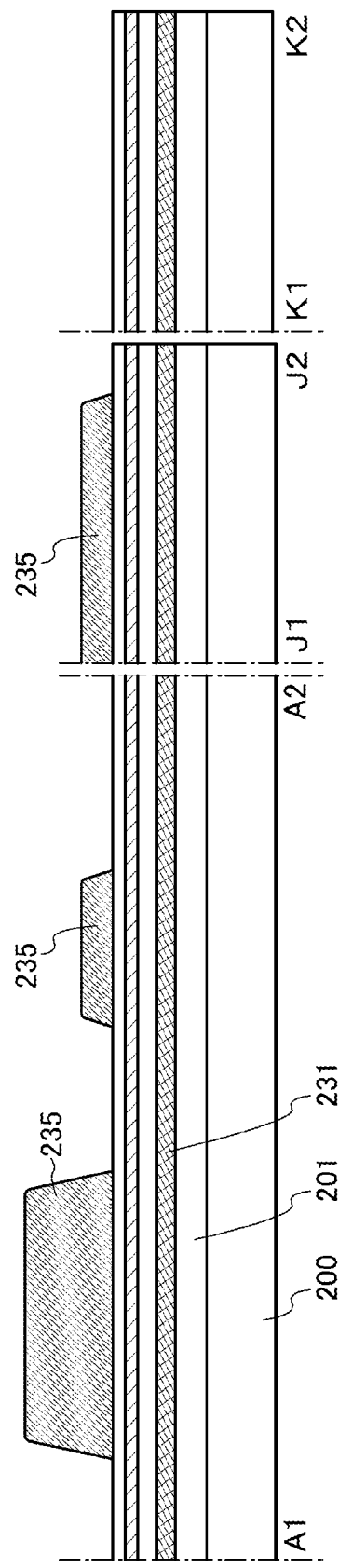

FIG. 4B illustrates a circuit configuration of the pixel 110. The pixel 110 includes a transistor 111, a liquid crystal element 112, and a capacitor 113. A gate electrode of the transistor 111 is electrically connected to the wiring 212-i, and one of a source electrode and a drain electrode of the transistor 111 is electrically connected to the wiring 216-j. The other of the source electrode and the drain electrode of the transistor 111 is electrically connected to one electrode of the liquid crystal element 112 and one electrode of the capacitor 113. The other electrode of the liquid crystal element 112 is electrically connected to an electrode 114. The potential of the electrode 114 may be a fixed potential such as 0 V, GND, or a common potential. The other electrode of the capacitor 113 is electrically connected to the wiring 203.

The transistor 111 has a function of selecting whether an image signal supplied from the wiring 216-j is input to the liquid crystal element 112. After a signal that turns on the transistor 111 is supplied to the wiring 212-i, an image signal is supplied to the liquid crystal element 112 from the wiring 216-j through the transistor 111. The transmittance of light is controlled in accordance with the image signal (potential) supplied to the liquid crystal element 112. The capacitor 113 has a function as a storage capacitor (also referred to as a Cs capacitor) for holding a potential supplied to the liquid crystal element 112. The capacitor 113 need not necessarily be provided; however, in the case of providing the capacitor 113, variation in the potential applied to the liquid crystal element 112, which is caused by a current flowing between the source electrode and the drain electrode in an off state of the transistor 111 (off-state current), can be suppressed.

For a semiconductor layer where a channel of the transistor 111 is formed, a single crystal semiconductor, a polycrystalline semiconductor, a microcrystalline semiconductor, an amorphous semiconductor, or the like can be used. Examples of a semiconductor material include silicon, germanium, silicon germanium, silicon carbide, and gallium arsenide. Alternatively, an oxide semiconductor can be used for the semiconductor layer where a channel of the transistor 111 is formed.

In general, the electron affinity of silicon, germanium, or the like is lower than the work function of metal. Therefore, in the case where it is necessary to obtain an ohmic contact between the semiconductor layer including silicon or germanium, and the source electrode or the drain electrode, it is necessary to provide an ohmic contact layer therebetween.

However, since the electron affinity of an oxide semiconductor is higher than that of silicon or germanium, an ohmic contact between the semiconductor layer including an oxide semiconductor, and the source electrode or the drain electrode can be obtained without an ohmic contact layer therebetween. For example, since the electron affinity of an In—Ga—Zn—O-based oxide semiconductor is about 4.3 eV, an ohmic contact between the semiconductor layer, and the source electrode or the drain electrode can be obtained without an ohmic contact layer in such a manner that an In—Ga—Zn—O-based oxide semiconductor is used for the semiconductor layer, and titanium which has a work function of about 4.1 eV, titanium nitride which has a work function of about 4.0 eV, or the like is used for the source electrode or the drain electrode connected to the semiconductor layer. With the use of an oxide semiconductor for the semiconductor layer, a manufacturing process of a semiconductor device can be simplified; thus, the productivity of the semiconductor device can be improved.

Figure 1B:
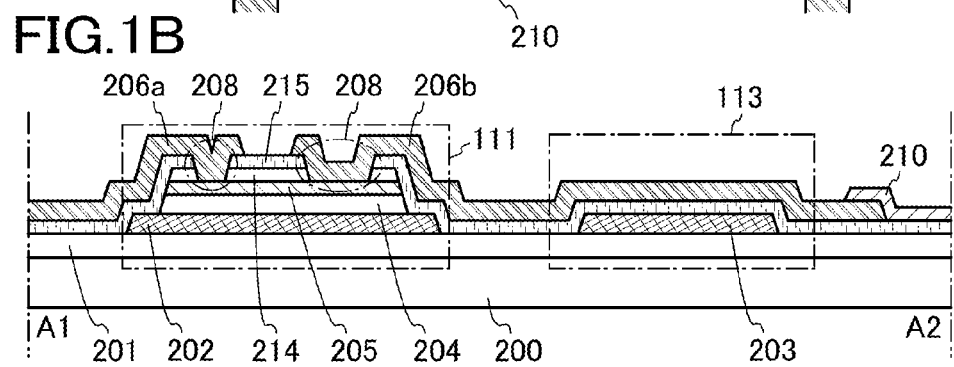
Figure 1C:
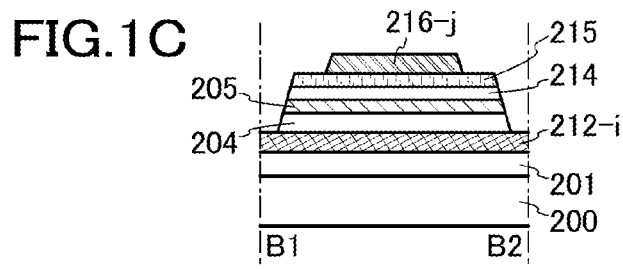

Next, an example of the configuration of the pixel 110 illustrated in FIGS. 4A and 4B will be described with reference to FIGS. 1A to 1C, FIGS. 2A and 2B, and FIGS. 3A and 3B. FIG. 1A is a top view illustrating the planar structure of the pixel 110, and FIG. 1B is a cross-sectional view illustrating the stacked-layer structure of a portion taken along the chain line A1-A2 in FIG. 1A. FIG. 1C is a cross-sectional view illustrating the stacked-layer structure of a portion taken along the chain line B1-B2 in FIG. 1A.

In the transistor 111 in this embodiment, a drain electrode 206b is surrounded by a source electrode 206a that is U-shaped (or C-shaped, square-bracket-like shaped, or horse-shoe-shaped). With such a shape, an enough channel width can be ensured even when the area of the transistor 111 is small, and accordingly, the amount of current flowing at the time of conduction of the transistor (also referred to as the on-state current) can be increased.

If parasitic capacitance generated between a gate electrode 202 and the drain electrode 206b electrically connected to a pixel electrode 210 is large, the transistor is easily influenced by feedthrough, which may cause degradation in display quality because the potential supplied to the liquid crystal element 112 cannot be held accurately. With the structure in which the source electrode 206a is U-shaped and surrounds the drain electrode 206b as described in this embodiment, an enough channel width can be ensured and parasitic capacitance generated between the drain electrode 206b and the gate electrode 202 can be reduced. Therefore, the display quality of a display device can be improved.

Further, when one of the source electrode 206a and the drain electrode 206b or both are provided so that a channel formation region of the transistor 111 is covered as much as possible, one of the source electrode 206a and the drain electrode 206b or both can function as a light-blocking layer. Deterioration in characteristics of the transistor due to light irradiation can be prevented by providing the light-blocking layer so as to overlap with the channel formation region of the semiconductor layer.

The wiring 203 functions as a capacitor electrode or a capacitor wiring. In this embodiment, the capacitor 113 is formed using the overlapping wiring 203, insulating layer 215, and drain electrode 206b.

The cross section A1-A2 shows the stacked-layer structure of the transistor 111 and the capacitor 113. Note that the transistor 111 in this embodiment is a bottom-gate transistor. Further, the cross section B1-B2 shows the stacked-layer structure of an intersection of the wiring 216-$j$ and the wiring 212-$i$.

In the cross section A1-A2 in FIG. 1B, an insulating layer 201 is formed over a substrate 200, and the gate electrode 202 and the wiring 203 are formed over the insulating layer 201. The insulating layer 201 functions as a base layer. Over the gate electrode 202, an insulating layer 204 functioning as a gate insulating layer, a semiconductor layer 205, and an insulating layer 214 and the insulating layer 215 each functioning as a channel protective layer are provided. In addition, the insulating layer 215 is formed so as to cover the side surfaces of the semiconductor layer 205 and also has a function of preventing entry of an impurity from the side surfaces of the semiconductor layer 205.

Further, the source electrode 206a and the drain electrode 206b are formed over the insulating layer 215, and are electrically connected to the semiconductor layer 205 through contact holes 208 formed in the insulating layer 214 and the insulating layer 215. Furthermore, the pixel electrode 210 is formed over the insulating layer 215 and is electrically connected to the drain electrode 206b.

A portion in which the wiring 203 and the drain electrode 206b overlap with each other with the insulating layer 215 interposed therebetween functions as the capacitor 113. The insulating layer 215 functions as a dielectric layer of the capacitor 113.

In the cross section B1-B2 in FIG. 1C, the insulating layer 201 is formed over the substrate 200, and the wiring 212-$i$ is formed over the insulating layer 201. The insulating layer 204 and the semiconductor layer 205 are formed over the wiring 212-$i$. The insulating layer 214 and the insulating layer 215 are formed over the semiconductor layer 205, and the wiring 216-$j$ is formed over the insulating layer 215.

By forming the insulating layers and the semiconductor layer described above between the wiring 216-$j$ and the wiring 212-$i$, the distance in the film thickness direction between both the wirings can be increased; thus, parasitic capacitance in the intersection of the wiring 216-$j$ and the wiring 212-$i$ can be reduced. By reducing the parasitic capacitance in the intersection, delay of a signal supplied to the wiring 216-$j$ and the wiring 212-$i$ or distortion of the waveform can be reduced; thus, a display device with high display quality can be achieved.

Figure 2A:
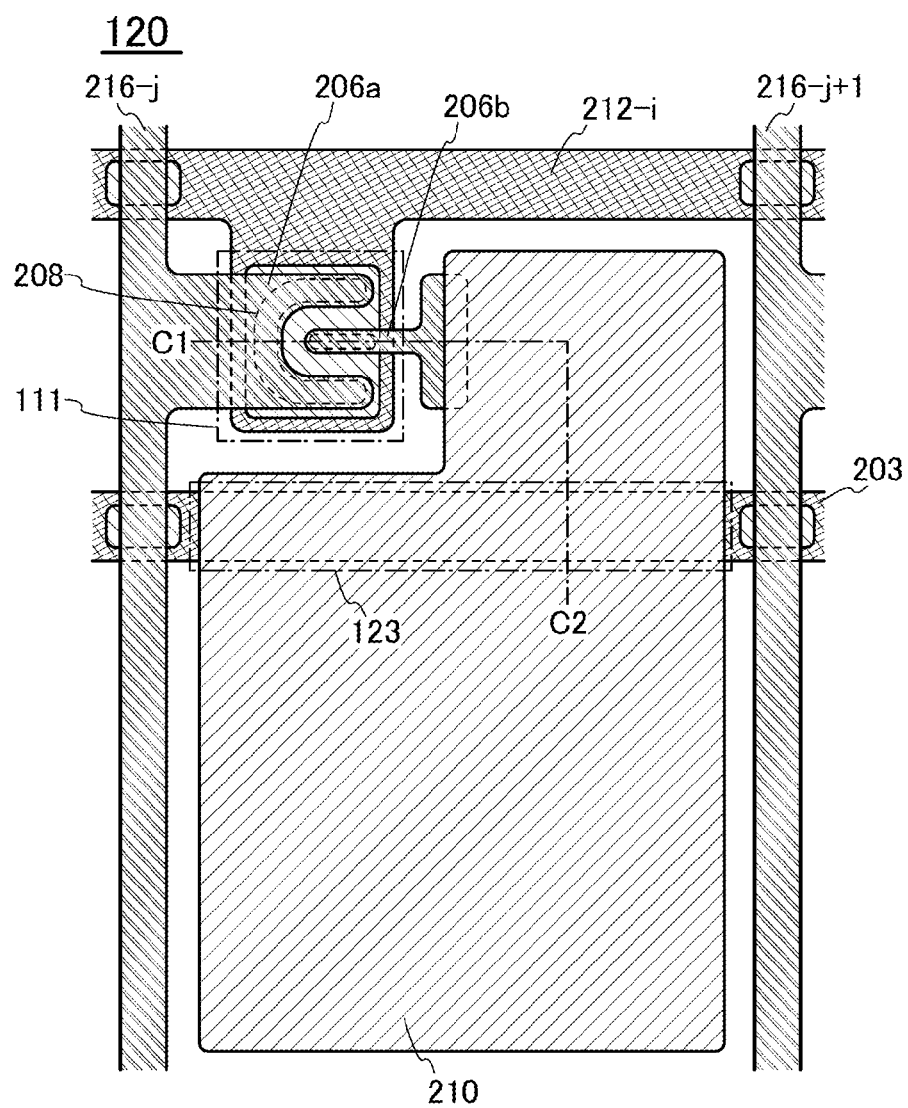
FIGS. 2A and 2B are a top view and a cross-sectional view, respectively, illustrating one embodiment of the present invention.
Figure 2B:
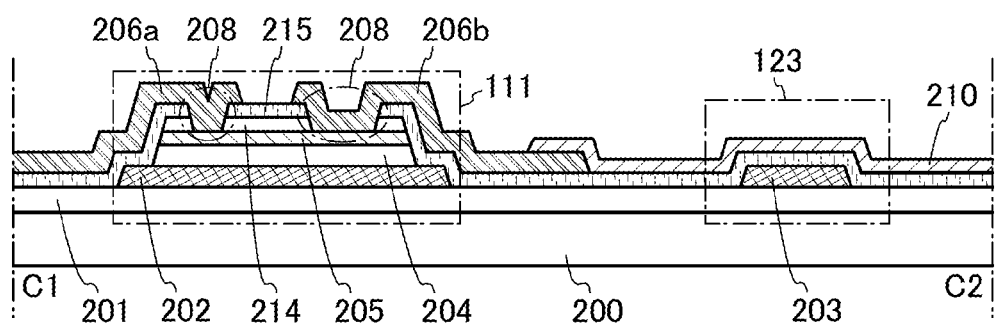

Next, a pixel 120 which can be replaced with the pixel 110 illustrated in FIGS. 1A to 1C and has a pixel configuration different from that of the pixel 110 will be described with reference to FIGS. 2A and 2B. FIG. 2A is a top view illustrating the planar structure of the pixel 120. A cross section C1-C2 illustrated in FIG. 2B corresponds to the cross section in a portion taken along the chain line C1-C2 in FIG. 2A. The pixel 120 illustrated in FIGS. 2A and 2B is different from the pixel 110 in the structure of the capacitor.

The wiring 203, the insulating layer 215, and the pixel electrode 210 are overlapped with one another to form a capacitor 123 included in the pixel 120. With the use of the pixel electrode for one electrode of the capacitor, the aperture ratio of the pixel 120 can be improved and the display quality of a display device can be improved because high definition can be easily achieved. Further, the light from a backlight can be used efficiently; thus, the power consumption of a display device can be reduced.

Figure 3A:
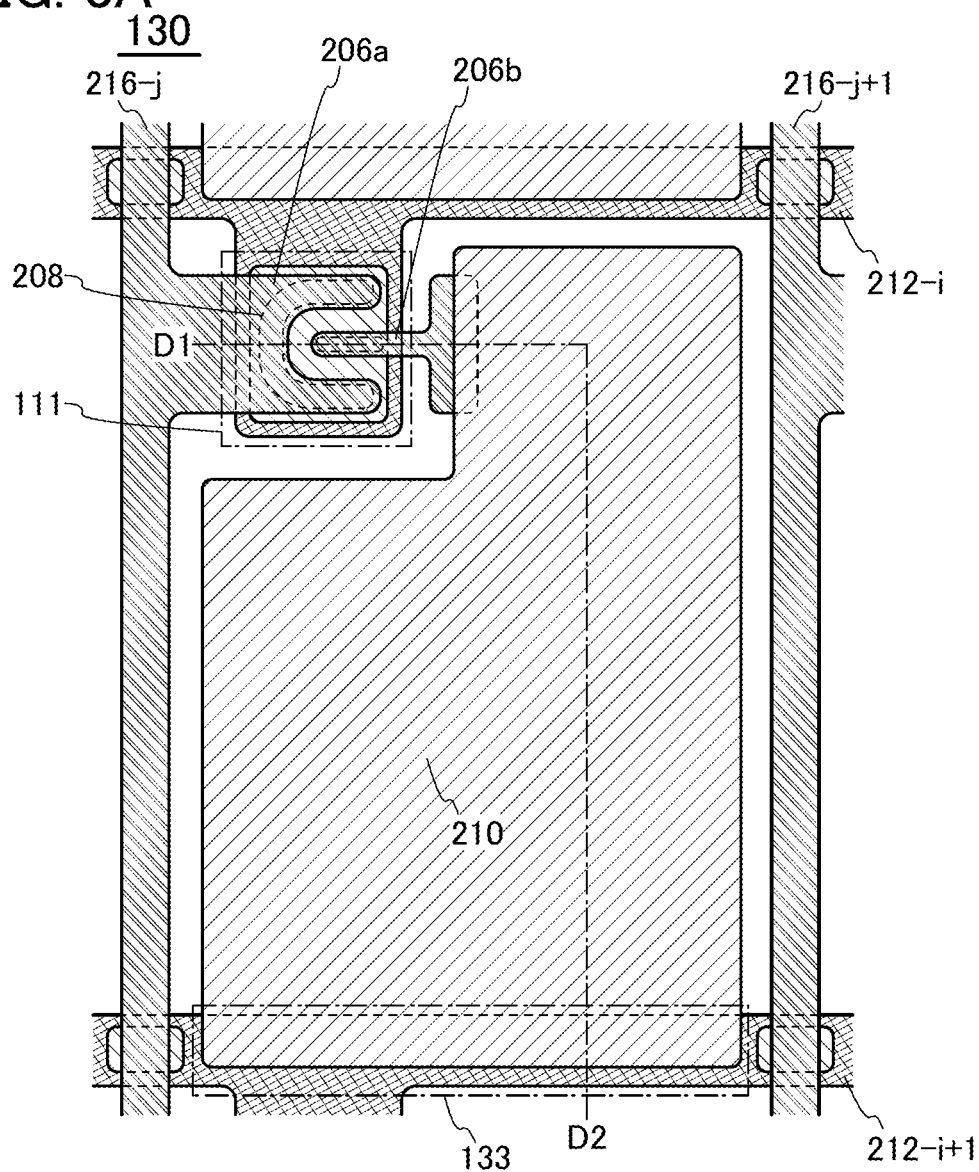
FIGS. 3A and 3B are a top view and a cross-sectional view, respectively, illustrating one embodiment of the present invention.
Figure 3B:
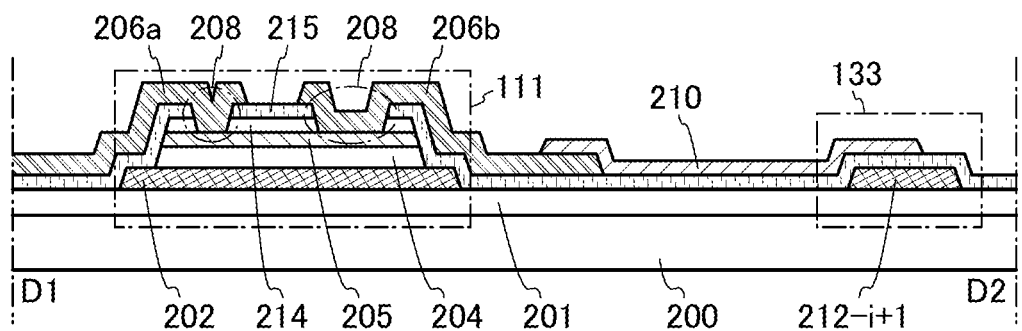

Subsequently, a pixel 130 which can be replaced with the pixel 110 illustrated in FIGS. 1A to 1C and the pixel 120 illustrated in FIGS. 2A and 2B and has a pixel configuration different from that of the pixel 110 and the pixel 120 will be described with reference to FIGS. 3A and 3B. FIG. 3A is a top view illustrating the planar structure of the pixel 130. A cross section D1-D2 illustrated in FIG. 3B corresponds to the cross section in a portion taken along the chain line D1-D2 in FIG. 3A. The pixel 130 illustrated in FIGS. 3A and 3B is different from the pixel 110 and the pixel 120 in the structure of the capacitor.

In the pixel 130, the wiring 203 is omitted, and a wiring 212-$i$+1 included in a pixel adjacent to the pixel 130, the insulating layer 215, and the pixel electrode 210 are overlapped with one another to form a capacitor 133. By omitting the wiring 203, the aperture ratio of the pixel 130 can be improved and the display quality of a display device can be improved because high definition can be easily achieved. Further, the light from a backlight can be used efficiently; thus, the power consumption of a display device can be reduced. Note that since the wiring 203 is omitted in the pixel 130, the terminal 107 of the semiconductor device 100 can also be omitted.

Next, examples of the structures of the terminal 105 (one of m terminals 105) and the terminal 106 (one of n terminals 106) will be described with reference to FIGS. 5A1, 5A2, 5B1, and 5B2. Note that the terminal 107 can have a structure similar to that of the terminal 105 or the terminal 106. FIGS. 5A1 and 5A2 are a top view and a cross-sectional view, respectively, of the terminal 105. The chain line J1-J2 in FIG. 5A1 corresponds to a cross section J1-J2 in FIG. 5A2. FIGS. 5B1 and 5B2 are a top view and a cross-sectional view, respectively, of the terminal 106. The chain line K1-K2 in FIG. 5B1 corresponds to a cross section K1-K2 in FIG. 5B2. In the cross sections J1-J2 and K1-K2, J2 and K2 correspond to end portion sides of the substrate.

In the cross section J1-J2, the insulating layer 201 is formed over the substrate 200, and the wiring 212 is formed over the insulating layer 201. The insulating layer 215 is formed over the wiring 212. An electrode 221 is formed over the insulating layer 215, and the electrode 221 is electrically connected to the wiring 212 through a contact hole 219 formed in the insulating layer 215. Further, an electrode 222 is formed over the electrode 221.

In the cross section K1-K2, the insulating layer 201 and the insulating layer 215 are formed over the substrate 200. The wiring 216 is formed over the insulating layer 215, and an electrode 223 is formed over the wiring 216.

Subsequently, a method for manufacturing the pixel 110 of a display device, which is described with reference to FIGS. 1A to 1C, and a method for manufacturing the terminal 105 and the terminal 106 which are described with reference to FIGS. 5A1, 5A2, 5B1, and 5B2 will be described with reference to FIGS. 6A and 6B, FIGS. 7A and 7B, FIGS. 8A and 8B, and FIGS. 9A to 9C. Note that cross sections A1-A2, J1-J2, and K1-K2 in FIGS. 6A and 6B, FIGS. 7A and 7B, FIGS. 8A and 8B, and FIGS. 9A to 9C are the cross-sectional views of the portions taken along the chain line A1-A2 in FIGS. 1A to 1C and the chain lines J1-J2 and K1-K2 in FIGS. 5A1, 5A2, 5B1, and 5B2.

First, the insulating layer 201, a conductive layer 231, an insulating layer 232, a semiconductor layer 233, and an insulating layer 234 are formed over the substrate 200. At this time, the insulating layer 201, the conductive layer 231, the insulating layer 232, the semiconductor layer 233, and the insulating layer 234 are successively formed without exposure to the air, whereby each of layers and interfaces thereof are prevented from being contaminated and thus the characteristics and the reliability of the semiconductor device can be improved (see FIG. 6A).

As the substrate 200, as well as a glass substrate or a ceramic substrate, a plastic substrate or the like having heat resistance to withstand a process temperature in this manufacturing process can be used. In the case where a substrate does not need a light-transmitting property, a metal substrate such as a stainless alloy substrate, whose surface is provided with an insulating layer, may be used. As the glass substrate, for example, an alkali-free glass substrate of barium borosilicate glass, aluminoborosilicate glass, aluminosilicate glass, or the like may be used. In addition, a quartz substrate, a sapphire substrate, or the like can be used. Note that more practical glass with heat resistance can be obtained when it contains a larger amount of barium oxide (BaO) than diboron trioxide ($B_2O_3$). Therefore, a glass substrate containing BaO and $B_2O_3$ so that the amount of BaO is larger than that of $B_2O_3$ is preferably used.

The insulating layer 201 can be formed to have a single-layer structure or a stacked-layer structure using one or more of the following insulating layers: an aluminum oxide layer, an aluminum nitride layer, an aluminum oxynitride layer, a silicon oxide layer, a silicon nitride layer, a silicon nitride oxide layer, and a silicon oxynitride layer. The insulating layer 201 has a function of preventing diffusion of impurity elements from the substrate 200. Note that in this specification, silicon nitride oxide contains more nitrogen than oxygen and, in the case where measurements are performed using RBS and HFS, preferably contains oxygen, nitrogen, silicon, and hydrogen at concentrations of greater than or equal to 5 atomic % and less than or equal to 30 atomic %, greater than or equal to 20 atomic % and less than or equal to 55 atomic %, greater than or equal to 25 atomic % and less than or equal to 35 atomic %, and greater than or equal to 10 atomic % and less than or equal to 30 atomic %, respectively. The insulating layer 201 can be formed by a sputtering method, a molecular beam epitaxy (MBE) method, a CVD method, a pulse laser deposition method, an atomic layer deposition (ALD) method, a coating method, a printing method, or the like as appropriate. Note that the insulating layer 201 is formed to a thickness of greater than or equal to 50 nm and less than or equal to 300 nm, preferably greater than or equal to 100 nm and less than or equal to 200 nm.

When a halogen element such as chlorine or fluorine is contained in the insulating layer 201 functioning as a base layer, a function of preventing diffusion of impurity elements from the substrate 200 can be further improved. The peak of the concentration of a halogen element contained in the insulating layer 201 may be higher than or equal to $1\times10^{15}/cm^3$ and lower than or equal to $1\times10^{20}/cm^3$ when measured by secondary ion mass spectrometry (SIMS).

Next, over the insulating layer 201, the conductive layer 231 is formed to a thickness of greater than or equal to 100 nm and less than or equal to 500 nm, preferably greater than or equal to 200 nm and less than or equal to 300 nm, by a sputtering method, a vacuum evaporation method, a plating method, or the like.

The conductive layer 231 can be formed to have a single-layer structure or a stacked-layer structure using a metal material such as molybdenum (Mo), titanium (Ti), tungsten (W), tantalum (Ta), aluminum (Al), copper (Cu), chromium (Cr), neodymium (Nd), scandium (Sc), or magnesium (Mg), or a material containing any of these elements as its main component. For example, the conductive layer 231 may be a stack of a Cu—Mg—Al alloy, and Cu or Al. By providing a Cu—Mg—Al alloy material in contact with the insulating layer 201, adhesion between the conductive layer 231 and the insulating layer 201 can be improved.

The conductive layer 231 is formed into an electrode or a wiring through a subsequent photolithography step; therefore, it is preferable to use Al or Cu which is a low-resistance material. When Al or Cu is used, delay of a signal or distortion of the waveform is reduced, so that a display device with high display quality can be obtained. Note that Al has low heat resistance; therefore, defects due to a hillock, a whisker, or migration tend to be caused. In order to prevent migration of Al, it is preferable to employ a stacked-layer structure of Al and a metal material having a higher melting point than Al, such as Mo, Ti, or W, or a material containing any of these metal materials as its main component. Alternatively, as long as the conductive layer 231 is not formed using an insulator, an oxide or a nitride of the above materials may be stacked. In the case where a material containing Al is used for the conductive layer 231, the maximum process temperature in subsequent steps is preferably lower than or equal to 380° C., further preferably lower than or equal to 350° C.

Also when Cu is used for the conductive layer 231, in order to prevent a defect due to migration and diffusion of Cu elements, it is preferable to employ a stacked-layer structure of Cu and a metal material having a higher melting point than Cu, such as Mo, Ti, or W, or a material containing any of these metal materials as its main component. Alternatively, as long as the conductive layer 231 is not formed using an insulator, an oxide or a nitride of the above materials may be stacked. For example, the conductive layer 231 may be a stack of titanium nitride and Cu. In the case where a material containing Cu is used for the conductive layer 231, the maximum process temperature in subsequent steps is preferably lower than or equal to 450° C.

In this embodiment, as the conductive layer 231, a 5-nm-thick titanium nitride layer is formed over the insulating layer 201 and a 250-nm-thick Cu layer is formed over the titanium nitride layer.

Next, the insulating layer 232 functioning as a gate insulating layer is formed over the conductive layer 231. The insulating layer 232 can be formed using silicon oxide, silicon nitride, silicon oxynitride, silicon nitride oxide, aluminum oxide, aluminum nitride, aluminum oxynitride, aluminum nitride oxide, tantalum oxide, yttrium oxide, lanthanum oxide, hafnium oxide, hafnium silicate ($HfSi_xO_y$ (x>0, y>0)), or the like by a method similar to that for forming the insulating layer 201. The insulating layer 232 is not limited to a single layer, and a stack of different layers may be used. For example, the insulating layer 232 may be formed in the following manner: a silicon nitride ($SiN_y$ (y>0)) layer is formed by a plasma CVD method as an insulating layer A and a silicon oxide ($SiO_x$ (x>0)) layer is stacked over the insulating layer A as an insulating layer B.

Other than a sputtering method, a plasma CVD method, and the like, the insulating layer 232 can be formed by a film formation method such as a high-density plasma CVD method using microwaves (e.g., a frequency of 2.45 GHz).

In this embodiment, a stack of a silicon nitride layer and a silicon oxide layer is used as the insulating layer 232. Specifically, a 50-nm-thick silicon nitride layer is formed over the conductive layer 231, and a 100-nm-thick silicon oxide layer is formed over the silicon nitride layer.

In the case where an oxide semiconductor is used for the semiconductor layer subsequently formed, the insulating layer 232 may be formed using an insulating material containing the same kind of component as the oxide semiconductor. In the case where layers of different materials to form the insulating layer 232 are stacked, a layer in contact with the oxide semiconductor may be formed using an insulating material containing the same kind of component as the oxide semiconductor. This is because such a material is compatible with the oxide semiconductor, and therefore, the use of such a material for the insulating layer 232 enables a state of the interface between the insulating layer 232 and the oxide semiconductor to be kept well. Here, "the same kind of component as the oxide semiconductor" means one or more elements selected from constituent elements of the oxide semiconductor. For example, in the case where the oxide semiconductor is formed using an In—Ga—Zn-based oxide semiconductor material, gallium oxide and the like are given as an insulating material containing the same kind of component as the oxide semiconductor.

In the case where a stacked-layer structure is employed for the insulating layer 232, the insulating layer 232 may have a stacked-layer structure of a film formed using an insulating material containing the same kind of component as the oxide semiconductor and a film formed using a material different from that of the film.

Next, the semiconductor layer 233 is formed over the insulating layer 232. Here, an example of using an oxide semiconductor for the semiconductor layer 233 is will be described. The oxide semiconductor can be formed by a sputtering method, an evaporation method, a PCVD method, a PLD method, an ALD method, an MBE method, or the like.

The oxide semiconductor is formed preferably by a sputtering method using an oxygen gas as a sputtering gas. At this time, the substrate heating temperature is higher than or equal to 100° C. and lower than or equal to 600° C., preferably higher than or equal to 150° C. and lower than or equal to 550° C., further preferably higher than or equal to 200° C. and lower than or equal to 500° C. The thickness of the oxide semiconductor is greater than or equal to 1 nm and less than or equal to 40 nm, preferably greater than or equal to 3 nm and less than or equal to 20 nm. As the substrate heating temperature at the time of film formation is higher, the impurity concentration in the obtained oxide semiconductor is lower.

In the case where the oxide semiconductor is used for the channel formation region of the transistor, as the oxide semiconductor is thinner, a short-channel effect of the transistor is reduced. However, when the oxide semiconductor is too thin, influence of interface scattering is enhanced; thus, the field effect mobility might be decreased in some cases.

As an oxide semiconductor used for the semiconductor layer 233, a four-component metal oxide such as an In—Sn—Ga—Zn-based oxide; a three-component metal oxide such as an In—Ga—Zn-based oxide, an In—Sn—Zn-based oxide, an In—Al—Zn-based oxide, a Sn—Ga—Zn-based oxide, an Al—Ga—Zn-based oxide, or a Sn—Al—Zn-based oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; an In-based oxide; a Sn-based oxide; a Zn-based oxide; or the like may be used. Further, silicon oxide may be contained in the above oxide semiconductor.

An oxide semiconductor preferably contains at least indium (In) or zinc (Zn). In particular, In and Zn are preferably contained. In order to obtain an i-type (intrinsic) oxide semiconductor, dehydration or dehydrogenation treatment and supply of oxygen to be performed later are effective.

Note that in the case where the oxide semiconductor is used for a channel formation region of a transistor, as a stabilizer for reducing the variation in electric characteristics of the transistor, the oxide semiconductor preferably contains gallium (Ga) in addition to In and Zn. Tin (Sn) is preferably contained as a stabilizer. In addition, hafnium (Hf) is preferably contained as a stabilizer. Moreover, aluminum (Al) is preferably contained as a stabilizer.

As another stabilizer, one or plural kinds of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu) may be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as "IGZO"), an In—Al—Zn-based oxide, an In—Sn—Zn-based oxide (also referred to as "ITZO"), a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that for example, the In—Ga—Zn-based oxide means an oxide containing indium (In), gallium (Ga), and zinc (Zn) and there is no particular limitation on the stoichiometric proportion. The In—Ga—Zn-based oxide may contain an element other than In, Ga, and Zn.

As the oxide semiconductor, a thin film represented by the chemical formula, $InMO_3(ZnO)_m$, (m>0) can be used. Here, M represents one or more metal elements selected from Sn, Zn, Fe, Ga, Al, Mn, and Co. Still alternatively, a material represented by $In_2SnO_5(ZnO)_n$ (n>0) may be used as the oxide semiconductor.

The oxide semiconductor may be either single crystal or non-single-crystal. In the latter case, the oxide semiconductor may be either amorphous or polycrystal. Further, the oxide semiconductor may have either an amorphous structure including a portion having crystallinity or a non-amorphous structure.

In an oxide semiconductor in an amorphous state, a flat surface can be obtained with relative ease, so that when a transistor is manufactured with the use of the oxide semiconductor, interface scattering can be reduced, and relatively high mobility can be obtained with relative ease.

In an oxide semiconductor having crystallinity, defects in the bulk can be further reduced and when a surface flatness is improved, mobility higher than that of an oxide semiconductor layer in an amorphous state can be obtained. In order to improve the surface flatness, the oxide semiconductor is preferably formed over a flat surface. Specifically, the oxide semiconductor may be formed over a surface with the average surface roughness (Ra) of less than or equal to 1 nm, preferably less than or equal to 0.3 nm, further preferably less than or equal to 0.1 nm.

In this embodiment, a 30-nm-thick oxide semiconductor is formed as an oxide semiconductor layer by a sputtering method with the use of an In—Ga—Zn-based oxide target. In addition, the oxide semiconductor layer can be formed by a sputtering method under a rare gas (typically, argon) atmosphere, an oxygen atmosphere, or a mixed atmosphere of a rare gas and oxygen. In the case where a mixed atmosphere of a rare gas and oxygen is used as a sputtering gas, the percentage of the oxygen gas is higher than or equal to 30 vol. %, preferably higher than or equal to 50 vol. %, further preferably higher than or equal to 80 vol. %.

As a target for forming the oxide semiconductor layer using an In—Ga—Zn-based oxide by a sputtering method, for example, a metal oxide target having a composition ratio of $In_2O_3:Ga_2O_3:ZnO=1:1:1$ [molar ratio] is used to form an In—Ga—Zn—O layer. Without limitation to the material and the composition of the above target, for example, a metal oxide target having a composition ratio of $In_2O_3:Ga_2O_3:ZnO=1:1:2$ [molar ratio], $In_2O_3:Ga_2O_3:ZnO=2:2:1$ [molar ratio], or $In_2O_3:Ga_2O_3:ZnO=1:1:4$ [molar ratio] may be used. Alternatively, a target having a composition ratio of $In_2O_3:Ga_2O_3:ZnO=2:0:1$ [molar ratio] can be used. Alternatively, an In—Ga—Zn-based metal oxide target having an atomic ratio of In:Ga:Zn=1:1:1, 4:2:3, 3:1:2, 1:1:2, 2:1:3, or 3:1:4 may be used.

In the case where the oxide semiconductor layer is formed using an In—Sn—Zn-based oxide material by a sputtering method, it is preferable to use an In—Sn—Zn-based metal oxide target having an atomic ratio of In:Sn:Zn=1:1:1, 2:1:3, 1:2:2, or 20:45:35.

The relative density of the metal oxide target is higher than or equal to 90% and lower than or equal to 100%, preferably higher than or equal to 95% and lower than or equal to 99.9%. With the use of a metal oxide target with a high relative density, the formed oxide semiconductor layer can be dense.

It is preferable that a high-purity gas from which impurities such as hydrogen, water, a hydroxyl group, or hydride are removed be used as a sputtering gas for the formation of the oxide semiconductor layer. For example, in the case where argon is used for the sputtering gas, it is preferable that the purity be 9N, the dew point be −121° C., the content of $H_2O$ be lower than or equal to 0.1 ppb, and the content of $H_2$ be lower than or equal to 0.5 ppb. In the case where oxygen is used for the sputtering gas, it is preferable that the purity be 8N, the dew point be −112° C., the content of $H_2O$ be lower than or equal to 1 ppb, and the content of $H_2$ be lower than or equal to 1 ppb.

When the oxide semiconductor layer is formed, the substrate is held in a film formation chamber kept under a reduced pressure, and the temperature of the substrate temperature is higher than or equal to 100° C. and lower than or equal to 600° C., preferably higher than or equal to 300° C. and lower than or equal to 500° C. Note that in the case where Al is used for the conductive layer 231, the substrate temperature is lower than or equal to 380° C., preferably lower than or equal to 350° C. Alternatively, in the case where Cu is used for the conductive layer 231, the substrate temperature is lower than or equal to 450° C.

By heating the substrate during the film formation, the concentration of impurities such as hydrogen, moisture, hydride, or hydroxide in the formed oxide semiconductor layer can be reduced. In addition, damage by sputtering can be reduced. Then, a sputtering gas from which hydrogen and moisture are removed is introduced into the film formation chamber and moisture remaining therein is removed, and the oxide semiconductor layer is formed with the use of the above target.

In order to remove moisture remaining in the film formation chamber, an entrapment vacuum pump such as a cryopump, an ion pump, or a titanium sublimation pump is preferably used. As an evacuation unit, a turbo molecular pump provided with a cold trap may be used. In the film formation chamber which is evacuated with the cryopump, a hydrogen atom, a compound containing a hydrogen atom such as water ($H_2O$) (further preferably, also a compound containing a carbon atom), and the like are removed, whereby the impurity concentration in the oxide semiconductor layer formed in the film formation chamber can be reduced.

An example of the film formation conditions is as follows: the distance between the substrate and the target is 100 mm; the pressure is 0.6 Pa, the direct current (DC) power is 0.5 kW; and oxygen (the proportion of the oxygen flow rate is 100%) is used as a sputtering gas. Note that a pulsed direct-current power source is preferably used, in which case powder substances (also referred to as particles or dust) that are generated in film formation can be reduced and the film thickness can be uniform.

Next, first heat treatment may be performed, if necessary. By the first heat treatment, excessive hydrogen (including water and a hydroxyl group) in the oxide semiconductor layer is removed (dehydration or dehydrogenation), the structure of the oxide semiconductor layer is ordered, and the impurity concentration in the oxide semiconductor layer can be reduced.

The first heat treatment is preferably performed at a temperature higher than or equal to 250° C. and lower than or equal to 750° C. or higher than or equal to 400° C. and lower than the strain point of the substrate in a reduced pressure atmosphere, an inert gas atmosphere such as a nitrogen atmosphere or a rare gas atmosphere, an oxygen gas atmosphere, or an ultra dry air atmosphere (in air whose moisture content is lower than or equal to 20 ppm (the dew point: −55° C.), preferably lower than or equal to 1 ppm, further preferably lower than or equal to 10 ppb in the case where measurement is performed using a dew-point meter of a cavity ring-down laser spectroscopy (CRDS) system). Note that in the case where Al is used for a wiring layer formed through a first photolithography step, the heat treatment temperature is lower than or equal to 380° C., preferably lower than or equal to 350° C. Alternatively, in the case where Cu is used for the wiring layer formed through the first photolithography step, the heat treatment temperature is lower than or equal to 450° C. In this embodiment, the substrate is introduced into an electric furnace which is a kind of heat treatment apparatuses, and heat treatment is performed on the oxide semiconductor layer at 450° C. in a nitrogen atmosphere for 1 hour.

Note that the heat treatment apparatus is not limited to the electrical furnace, and may include a device for heating a process object by heat conduction or heat radiation from a heating element such as a resistance heating element. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating a process object by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for heat treatment using a high-temperature gas. As the high-temperature gas, an inert gas which does not react with a process object by heat treatment, such as nitrogen or a rare gas like argon, is used.

For example, as the first heat treatment, GRTA may be performed as follows. The substrate is transferred and put in an inert gas heated to a high temperature, is heated for several minutes, and is transferred and taken out of the inert gas heated to the high temperature.

When the first heat treatment is performed in an atmosphere of an inert gas such as nitrogen or a rare gas, oxygen, or ultra-dry air, it is preferable that the atmosphere do not contain water, hydrogen, or the like. It is also preferable that the purity of nitrogen, oxygen, or the rare gas which is introduced into a heat treatment apparatus be higher than or equal to 6N (99.9999%), preferably higher than or equal to 7N (99.99999%) (that is, the impurity concentration is lower than or equal to 1 ppm, preferably lower than or equal to 0.1 ppm).

The first heat treatment is preferably performed in such a manner that after heat treatment is performed in a reduced pressure atmosphere or an inert atmosphere, the atmosphere is switched to an oxidation atmosphere with the temperature maintained and heat treatment is further performed. When the heat treatment is performed in a reduced pressure atmosphere or an inert atmosphere, the impurity concentration in the oxide semiconductor layer can be reduced; however, oxygen deficiency is caused at the same time. By the heat treatment in the oxidation atmosphere, the caused oxygen deficiency can be reduced.

Further, the first heat treatment may be performed anytime after the oxide semiconductor layer is formed.

Next, the insulating layer 234 is formed over the semiconductor layer 233. The insulating layer 234 can be formed using a material and a method similar to those of the insulating layer 201 or the insulating layer 232.

In the case where an oxide semiconductor is used for the semiconductor layer 233, an insulator containing oxygen is preferably used for the insulating layer 234. Note that in the case where an oxide semiconductor is used for the semiconductor layer 233, a metal oxide containing the same kind of component as the oxide semiconductor may be formed.

In this embodiment, a 200-nm-thick silicon oxide layer is formed as the insulating layer 234 by a sputtering method. The substrate temperature in film formation may be higher than or equal to room temperature and lower than or equal to 300° C. and, in this embodiment, is 100° C. The silicon oxide layer can be formed by sputtering in a rare gas (typically argon) atmosphere, an oxygen atmosphere, or a mixed atmosphere of a rare gas and oxygen. As a target, a silicon oxide or silicon can be used. For example, a silicon oxide layer can be formed by sputtering in an atmosphere containing oxygen with the use of silicon for the target.

In order to remove remaining moisture from the film formation chamber at the time of formation of the insulating layer 234, an entrapment vacuum pump (e.g., a cryopump) is preferably used. When the insulating layer 234 is formed in the film formation chamber evacuated using a cryopump, the impurity concentration in the insulating layer 234 can be reduced. In addition, as an evacuation unit for removing moisture remaining in the chamber used for depositing the insulating layer 234, a turbo molecular pump provided with a cold trap may be used.

It is preferable that a high-purity gas from which impurities such as hydrogen, water, a hydroxyl group, or hydride are removed be used as a sputtering gas for the formation of the insulating layer 234.

Then, if necessary, second heat treatment may be performed in a reduced pressure atmosphere, an inert gas atmosphere, an oxygen gas atmosphere, or an ultra-dry air atmosphere (preferably at a temperature higher than or equal to 200° C. and lower than or equal to 600° C., for example, higher than or equal to 250° C. and lower than or equal to 550° C.). Note that in the case where Al is used for the conductive layer 231, the heat treatment temperature is lower than or equal to 380° C., preferably lower than or equal to 350° C. Alternatively, in the case where Cu is used for the conductive layer 231, the heat treatment temperature is lower than or equal to 450° C. For example, the second heat treatment may be performed at 450° C. in a nitrogen atmosphere for 1 hour. By the second heat treatment, the oxide semiconductor layer is heated in the state of being in contact with the insulating layer 234, so that oxygen can be supplied from the insulating layer 234 containing oxygen to the semiconductor layer 233. Note that the first heat treatment serving as the second heat treatment may be performed after the insulating layer 234 is formed. Alternatively, the supply of oxygen to the semiconductor layer 233 may be performed using an ion implantation method, an ion doping method, or the like.

Next, the first photolithography step is performed. First, a resist mask 235 is formed over the insulating layer 234 using a multi-tone mask as a first photomask (see FIG. 6B).

Here, a multi-tone mask will be described with reference to FIGS. 13A to 13D. A multi-tone mask can perform three levels of light exposure to obtain an exposed portion, a half-exposed portion, and an unexposed portion. A multi-tone mask is a mask through which light is transmitted to have a plurality of intensities. One-time light exposure and development process can form a resist mask with regions of plural thicknesses (typically, two kinds of thicknesses) to be formed. Thus, the number of light-exposure masks (photomasks) can be reduced by using a multi-tone mask.

Figure 13A:
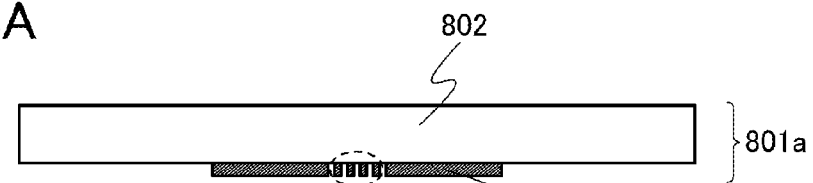
FIGS. 13A to 13D are diagrams describing examples of a multi-tone mask.
Figure 13B:
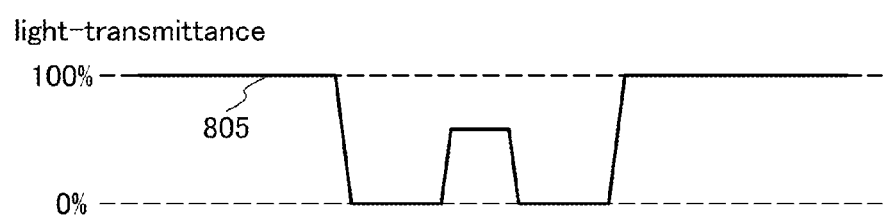
Figure 13C:
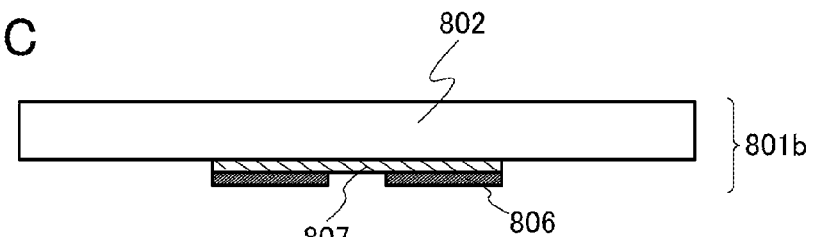

As typical examples of the multi-tone mask, a gray-tone mask 801a illustrated in FIG. 13A and a half-tone mask 801b illustrated in FIG. 13C are given.

As illustrated in FIG. 13A, the gray-tone mask 801a includes a light-transmitting substrate 802, and a light-blocking portion 803 and a diffraction grating 804 which are formed on the light-transmitting substrate 802. The light transmittance of the light-blocking portion 803 is 0%. On the other hand, the diffraction grating 804 has a light-transmitting portion in a slit form, a dot form, a mesh form, or the like with intervals which are equal to or less than the resolution limit of light used for the light exposure; thus, the light transmittance can be controlled. The diffraction grating 804 can have regularly-arranged slits, dots, or meshes, or irregularly-arranged slits, dots, or meshes.

As the light-transmitting substrate 802, a light-transmitting substrate such as a quartz substrate can be used. The light-blocking portion 803 and the diffraction grating 804 can be formed using a light-blocking material which absorbs light, such as chromium or chromium oxide.

When the gray-tone mask 801a is irradiated with light for exposure, a light transmittance 805 of the light-blocking portion 803 is 0% and the light transmittance 805 of a region where neither the light-blocking portion 803 nor the diffraction grating 804 is provided is 100%, as illustrated in FIG. 13B. The light transmittance of the diffraction grating 804 can be controlled in the range of from 10% to 70%. The light transmittance of the diffraction grating 804 can be controlled by adjusting the interval and pitch of slits, dots, or meshes of the diffraction grating.

As illustrated in FIG. 13C, the half-tone mask 801b includes the light-transmitting substrate 802, and a semi-light-transmitting portion 807 and a light-blocking portion 806 which are formed on the light-transmitting substrate 802. The semi-light-transmitting portion 807 can be formed using MoSiN, MoSi, MoSiO, MoSiON, CrSi, or the like. The light-blocking portion 806 can be formed using a light-blocking material which absorbs light, such as chromium or chromium oxide.

Figure 13D:
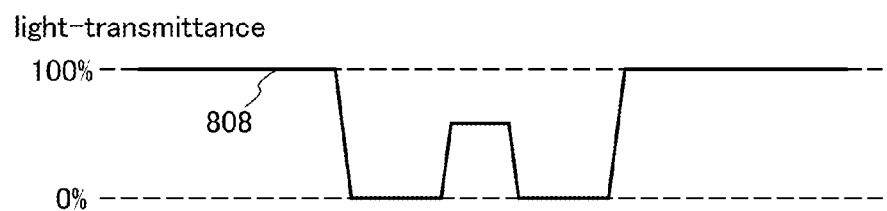

When the gray-tone mask 801b is irradiated with light for exposure, a light transmittance 808 of the light-blocking portion 806 is 0% and the light transmittance 808 of a region where neither the light-blocking portion 806 nor the semi-light-transmitting portion 807 is provided is 100%, as illustrated in FIG. 13D. The light transmittance of the semi-light-transmitting portion 807 can be controlled in the range of from 10% to 70%. The light transmittance of the semi-light-transmitting portion 807 can be controlled with the material of the semi-light-transmitting portion 807.

The resist mask 235 formed using a multi-tone mask is a resist mask including a plurality of regions (here, two regions) having different thicknesses; a region having a large thickness and a region having a small thickness. A region of the resist mask 235, which has a large thickness, is referred to as a projecting portion of the resist mask 235. A region of the resist mask 235, which has a small thickness, is referred to as a depressed portion of the resist mask 235.

The conductive layer 231, the insulating layer 232, the semiconductor layer 233, and the insulating layer 234 are selectively etched using the resist mask 235 as a mask to form the gate electrode 202, the wiring 203, the wiring 212, the island-like insulating layer 204, the island-like semiconductor layer 205, and the island-like insulating layer 214 (see FIG. 7A).

For the etching of the conductive layer 231, the insulating layer 232, the semiconductor layer 233, and the insulating layer 234, either dry etching or wet etching or both of them may be used. For example, a gas containing chlorine (a chlorine-based gas such as chlorine ($Cl_2$), boron trichloride ($BCl_3$), silicon tetrachloride ($SiCl_4$), or carbon tetrachloride ($CCl_4$)) can be employed as an etching gas used for the dry etching.

As the dry etching, a parallel-plate reactive ion etching (RIE) method or an inductively coupled plasma (ICP) etching method can be used. Since the insulating layer 201 has a function of preventing diffusion of impurity elements from the substrate 200, for the above etching, etching conditions are preferably adjusted so as to etch the insulating layer 201 as little as possible. Note that the insulating layer 201 is preferably formed using a material which is hardly etched during the above etching.

Next, the resist mask 235 is downsized by oxygen plasma ashing or the like. At this time, a region having a small thickness in the resist mask 235 is removed, and the island-like insulating layer 214 is exposed (see FIG. 7B).

Next, part of the gate electrode 202, part of the wiring 203, and part of the wiring 212 are exposed by selective removal of the island-like insulating layer 204, the island-like semiconductor layer 205, and the island-like insulating layer 214, using the remaining resist mask 235 as a mask. At this time, the side surfaces of the island-like insulating layer 204, the island-like semiconductor layer 205, and the island-like insulating layer 214 on each side are substantially aligned with one another, and each layer has a substantially similar shape when seen from the above.

Further, the end portions of the gate electrode 202 are projected outside the end portions of the island-like insulating layer 204, the island-like semiconductor layer 205, and the island-like insulating layer 214, whereby a step is suppressed and coverage with an insulating layer or a conductive layer which will be formed later can be improved (see FIG. 8A).

Deterioration in characteristics of the transistor due to light irradiation from the gate electrode 202 side can be prevented by providing the island-like semiconductor layer 205 so as to overlap with the gate electrode 202 and providing the island-like semiconductor layer 205 to be smaller than the gate electrode 202.

Note that although not illustrated, in order to reduce parasitic capacitance in an intersection of the wiring 216 which will be formed later and the wiring 203 and an intersection of the wiring 216 and the wiring 212, the island-like insulating layer 204, the island-like semiconductor layer 205, and the island-like insulating layer 214 are left over the portions of the wiring 203 and the wiring 212, which correspond to the intersections.

Then, the resist mask 235 is removed. By using the multi-tone mask, a plurality of photolithography steps can be replaced with one photolithography step. Accordingly, the productivity of a semiconductor device can be improved.

Note that unless otherwise specified, a photolithography step in this specification includes a step of forming a resist mask, a step of etching a conductive layer or an insulating layer, and a step of separating the resist mask.

Next, the insulating layer 215 is formed over the island-like insulating layer 214, the wiring 203, and the wiring 212. The insulating layer 215 can be formed using a material and a method similar to those of the insulating layer 201, the insulating layer 232 (the island-like insulating layer 204), and the insulating layer 234 (the island-like insulating layer 214). Further, since the insulating layer 215 functions as a dielectric layer of the capacitor 113, a material having a high relative permittivity is preferably used. In this embodiment, a 200-nm-thick silicon nitride layer is formed as the insulating layer 215 by a sputtering method. A silicon nitride layer is preferable because the relative permittivity is higher than that of a silicon oxide layer and it can function as a protective layer for preventing entry of an impurity from the outside (see FIG. 8B).

Next, the contact holes 208 and the contact hole 219 are formed by selective removal of the insulating layer 215 and the insulating layer 214 through a second photolithography step using a second photomask. Part of the semiconductor layer 205 is exposed in the contact holes 208 and part of the wiring 212 is exposed in the contact hole 219 (see FIG. 9A). Further, the areas of the contact holes are preferably made large as much as possible or the number of contact holes is preferably made large in order to reduce the contact resistance.

Then, a conductive layer is formed over the insulating layer 215, and the source electrode 206a, the drain electrode 206b, the electrode 221, and the wiring 216 are formed through a third photolithography step using a third photomask (see FIG. 9B). The conductive layer for forming the source electrode 206a, the drain electrode 206b, the electrode 221, and the wiring 216 can be formed using a material and a method similar to those of the conductive layer 231. In this embodiment, as the conductive layer, by a sputtering method, a 5-nm-thick titanium nitride layer is formed over the insulating layer 215 and a 250-nm-thick Cu layer is formed over the titanium nitride layer.

Next, a light-transmitting conductive layer is formed over the source electrode 206a, the drain electrode 206b, the electrode 221, and the wiring 216; and the pixel electrode 210, the electrode 222, and the electrode 223 are formed through a fourth photolithography step using a fourth photomask (see FIG. 9C).

For the light-transmitting conductive layer, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

Furthermore, in order to prevent oxidation of the source electrode 206a, the drain electrode 206b, the wiring 216, and the like, part of or entire of these electrodes or the wiring can be covered with the conductive layer for forming the pixel electrode 210.

In this embodiment, an example of a method for manufacturing a pixel portion of a transmissive display device is described. However, without limitation thereto, one embodiment of the present invention can be applied to a pixel portion of a reflective display device as well. In the case where a pixel portion of a reflective display device is obtained, the pixel electrode may be formed using a conductive layer with high light reflectance (also referred to as a reflective conductive layer); for example, a metal having high visible-light reflectance, such as aluminum, titanium, silver, rhodium, or nickel; an alloy containing at least one of the above metals; or stacked layers of the above materials may be used.

As needed, the same material as the pixel electrode can be placed so as to overlap with the channel formation region of the semiconductor layer.

In this embodiment, a 80-nm-thick ITO layer is formed as the light-transmitting conductive layer. The ITO layer can be etched using an etchant ITO-07N for etching a transparent conductive film, which is produced by KANTO CHEMICAL CO., INC.

In addition, in the terminal portion 103 and the terminal portion 104, it is important that the wiring 212 and the wiring 216 be not kept in an exposed state and be covered with an oxide conductive material such as ITO. When the wiring 212 and the wiring 216 which are metal layers are kept in an exposed state, exposed surfaces are oxidized and contact resistance with an FPC or the like is increased. The increase in contact resistance causes distortion in waveform or delay of a signal that is input from the outside; therefore, a signal from the outside cannot be transmitted correctly, so that the reliability of the semiconductor device is lowered. By covering the exposed surfaces of the wiring 212 and the wiring 216 with an oxide conductive material such as ITO, the increase in contact resistance with an FPC or the like can be prevented, and the reliability of the semiconductor device can be improved.

In accordance with the above manufacturing method, the pixel 110 including the transistor 111 and the capacitor 113, the terminal 105, and the terminal 106 can be formed. In addition, the pixel 120 and the pixel 130 can be formed using a manufacturing method which is similar to that of the pixel 110.

Further, in the semiconductor layer 205, the top surface and side surfaces are covered with the insulating layer 215 and the bottom surface is covered with the gate electrode 202 which is a metal layer; therefore, entry of an impurity from the outside hardly occurs, and a highly reliable semiconductor device can be obtained. Additionally, when the insulating layer 215 and the insulating layer 201 are formed using silicon nitride films and the semiconductor layer 205 is covered with the silicon nitride film, the reliability of the semiconductor device can be further improved.

According to this embodiment, a semiconductor device can be manufactured with a smaller number of photomasks and a smaller number of photolithography steps than the conventional ones. Therefore, a display device can be manufactured at low cost with high productivity.

This embodiment can be implemented in appropriate combination with the other embodiments.

Embodiment 2

Figure 10A:
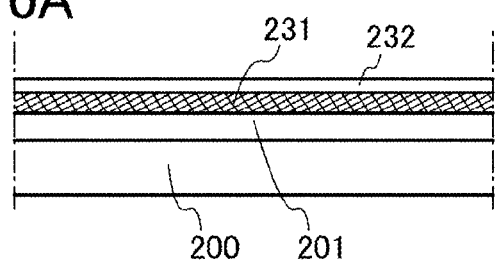
FIGS. 10A to 10C are cross-sectional views illustrating one embodiment of the present invention.
Figure 10B:
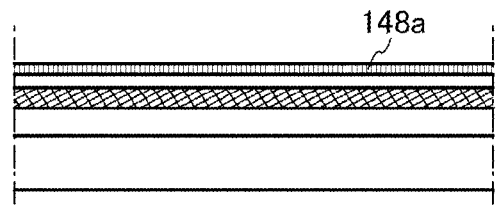
Figure 10C:
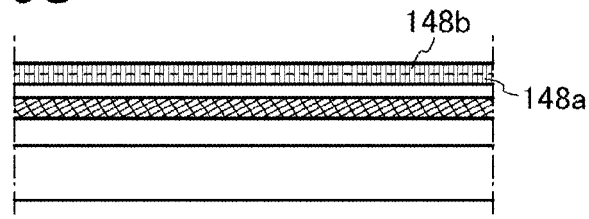

In this embodiment, an example of a process which is partly different from that described in Embodiment 1 will be described with reference to FIGS. 10A to 10C. Note that in FIGS. 10A to 10C, the same reference numerals are used for the same parts as those in Embodiment 1, and description of the parts with the same reference numerals will be omitted here.

First, as in Embodiment 1, the insulating layer 201 is formed over the substrate 200, and the conductive layer 231 is formed over the insulating layer 201. In this embodiment, a three-layer structure including Cu between two layers of Mo is employed for the conductive layer 231 because the film formation temperature of a semiconductor layer to be formed later is higher than or equal to 200° C. and lower than or equal to 450° C. and the temperature of heat treatment after the formation of the semiconductor layer is higher than or equal to 200° C. and lower than or equal to 450° C.

Then, the insulating layer 232 is provided over the conductive layer 231, and a first oxide semiconductor layer is formed to a thickness of greater than or equal to 1 nm and less than or equal to 10 nm over the insulating layer 232. In this embodiment, the first oxide semiconductor layer is formed to a thickness of 5 nm by using a sputtering gas of oxygen, argon, or a mixture of argon and oxygen under such conditions that a target for an oxide semiconductor (a target for an In—Ga—Zn-based oxide semiconductor containing $In_2O_3$, $Ga_2O_3$, and ZnO at 1:1:2 [molar ratio]) is used, the distance between the substrate and the target is 170 mm, the substrate temperature is 250° C., the pressure is 0.4 Pa, and the direct current (DC) power is 0.5 kW.

Next, first heat treatment is performed by setting an atmosphere where the substrate is placed to a nitrogen atmosphere or dry air. The temperature of the first heat treatment is higher than or equal to 200° C. and lower than or equal to 450° C. In addition, heating time of the first heat treatment is longer than or equal to 1 hour and shorter than or equal to 24 hours. By the first heat treatment, the first oxide semiconductor layer is crystallized and a first crystalline oxide semiconductor layer 148a is formed (see FIG. 10B).

Next, a second oxide semiconductor layer with a thickness of greater than 10 nm is formed over the first crystalline oxide semiconductor layer 148a. In this embodiment, the second oxide semiconductor layer is formed to a thickness of 25 nm by using a sputtering gas of oxygen, argon, or a mixture of argon and oxygen under such conditions that a target for an oxide semiconductor (a target for an In—Ga—Zn-based oxide semiconductor containing $In_2O_3$, $Ga_2O_3$, and ZnO at 1:1:2 [molar ratio]) is used; the distance between the substrate and the target is 170 mm; the substrate temperature is 400° C.; the pressure is 0.4 Pa; and the direct current (DC) power is 0.5 kW.

Then, second heat treatment is performed by setting an atmosphere where the substrate is placed to a nitrogen atmosphere or dry air. The temperature of the second heat treatment is higher than or equal to 200° C. and lower than or equal to 450° C. In addition, heating time of the second heat treatment is longer than or equal to 1 hour and shorter than or equal to 24 hours. By the second heat treatment, the second oxide semiconductor layer is crystallized and a second crystalline oxide semiconductor layer 148b is formed (see FIG. 10C).

Next, the insulating layer 234 is formed over the second crystalline oxide semiconductor layer 148b. In the following process, in accordance with Embodiment 1, the transistor 111 can be obtained. Note that in the case where this embodiment is employed, the stack of the first crystalline oxide semiconductor layer 148a and the second crystalline oxide semiconductor layer 148b form a semiconductor layer including a channel formation region of the transistor 111. The first crystalline oxide semiconductor layer 148a and the second crystalline oxide semiconductor layer 148b have c-axis alignment.

In the case of the transistor including stacked layers of the first crystalline oxide semiconductor layer and the second crystalline oxide semiconductor layer, the amount of change in threshold voltage of the transistor between before and after being irradiated with light or being subjected to a bias-temperature (BT) stress test can be reduced; thus, such a transistor has stable electric characteristics.

This embodiment can be freely combined with any of the other embodiments.

Embodiment 3

Figure 11A:
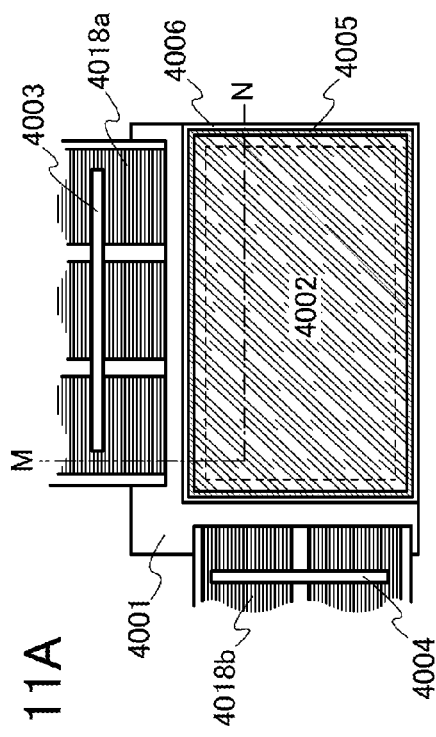
FIGS. 11A and 11B are a top view and a cross-sectional view, respectively, illustrating one embodiment of the present invention.
Figure 11B:
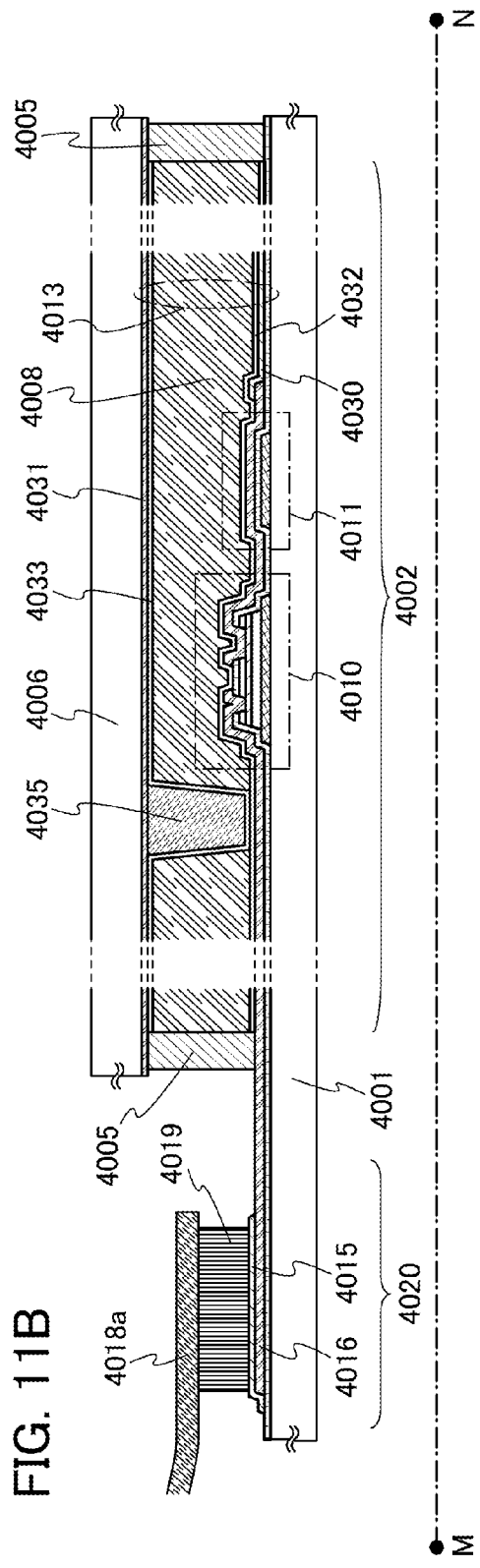

One mode of a display device in which any of the transistors described in Embodiment 1 and Embodiment 2 is used is illustrated in FIGS. 11A and 11B.

FIG. 11A is a plan view of a panel in which a transistor 4010 and a liquid crystal element 4013 are sealed between a first substrate 4001 and a second substrate 4006 with a sealant 4005. FIG. 11B is a cross-sectional view taken along line M-N in FIG. 11A.

The sealant 4005 is provided so as to surround a pixel portion 4002 provided over the first substrate 4001. The second substrate 4006 is provided over the pixel portion 4002. Accordingly, the pixel portion 4002 is sealed together with a liquid crystal layer 4008 by the first substrate 4001, the sealant 4005, and the second substrate 4006.

Further, an input terminal 4020 is provided in a region over the first substrate 4001 outside a region surrounded by the sealant 4005, and flexible printed circuits (FPCs) 4018a and 4018b are connected to the input terminal 4020. The FPC 4018a is electrically connected to a signal line driver circuit 4003 which is separately provided over another substrate, and the FPC 4018b is electrically connected to a scan line driver circuit 4004 which is separately provided over another substrate. Various signals and potentials supplied to the pixel portion 4002 are supplied from the signal line driver circuit 4003 and the scan line driver circuit 4004 via the FPC 4018a and the FPC 4018b.

Note that a connection method of separately formed driver circuits is not particularly limited, and a chip on glass (COG) method, a wire bonding method, a tape carrier package (TCP) method, a tape automated bonding (TAB) method, or the like can be used.

Although not illustrated, the signal line driver circuit 4003 or the scan line driver circuit 4004 may be provided over the substrate 4001 with the use of the transistor disclosed in this specification.

As a display element provided in the display device, a liquid crystal element (also referred to as a liquid crystal display element) can be used. Furthermore, a display medium whose contrast is changed by an electric effect, such as electronic ink, can be used.

The display device illustrated in FIGS. 11A and 11B includes an electrode 4015 and a wiring 4016. The electrode 4015 and the wiring 4016 are electrically connected to a terminal included in the FPC 4018a via an anisotropic conductive layer 4019.

The electrode 4015 is formed using the same conductive layer as a first electrode 4030, and the wiring 4016 is formed using the same conductive layer as a source electrode and a drain electrode of the transistor 4010.

In this embodiment, any of the transistors described in Embodiment 1 and Embodiment 2 can be applied to the transistor 4010. The transistor 4010 provided in the pixel portion 4002 is electrically connected to a display element to form a display panel. A variety of display elements can be used for the display element as long as display can be performed.

FIGS. 11A and 11B illustrate an example of a display device in which a liquid crystal element is used as a display element. In FIGS. 11A and 11B, the liquid crystal element 4013 which is a display element includes the first electrode 4030, a second electrode 4031, and the liquid crystal layer 4008. Note that an insulating layer 4032 and an insulating layer 4033 each functioning as alignment films are provided so that the liquid crystal layer 4008 is provided therebetween. The second electrode 4031 is formed on the second substrate 4006 side. The first electrode 4030 and the second electrode 4031 are stacked with the liquid crystal layer 4008 provided therebetween.

A spacer 4035 is a columnar spacer which is formed on the second substrate 4006 using an insulating layer and is provided to control the thickness of the liquid crystal layer 4008 (a cell gap). Alternatively, a spherical spacer may be used.

In the case where a liquid crystal element is used as the display element, a liquid crystal material such as a thermotropic liquid crystal, a low-molecular liquid crystal, a high-molecular liquid crystal, a polymer dispersed liquid crystal, a ferroelectric liquid crystal, or an anti-ferroelectric liquid crystal can be used for the liquid crystal layer 4008. These liquid crystal materials exhibit a cholesteric phase, a smectic phase, a cubic phase, a chiral nematic phase, an isotropic phase, or the like depending on conditions.

Alternatively, a liquid crystal material exhibiting a blue phase for which an alignment film is unnecessary may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral material is mixed is used for the liquid crystal layer in order to improve the temperature range. The liquid crystal composition which includes a liquid crystal material exhibiting a blue phase and a chiral agent has a short response time of 1 msec or less, and has optical isotropy, which makes the alignment process unneeded and viewing angle dependence small. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, the productivity of the liquid crystal display device can be increased.

The specific resistivity of the liquid crystal material is higher than or equal to $1\times10^9$ Ω·cm, preferably higher than or equal to $1\times10^{11}$ Ω·cm, further preferably higher than or equal to $1\times10^{12}$ Ω·cm. The value of the specific resistivity in this specification is measured at 20° C.

The capacitance of a capacitor 4011 (a storage capacitor) formed in each pixel of the liquid crystal display device is set considering the leakage current of the transistor 4010 provided in each pixel, or the like so that electric charge can be held for a predetermined period. By using the transistor 4010 in which an i-type or substantially i-type oxide semiconductor is used for a semiconductor layer where a channel is formed, it is enough to provide a storage capacitor having capacitance that is less than or equal to ⅓, preferably less than or equal to ⅕ of liquid crystal capacitance of each pixel.

In the transistor including an i-type or substantially i-type oxide semiconductor layer, the current in an off state (the off-state current) can be made small. Accordingly, an electrical signal such as an image signal can be held for a longer period, and a writing interval can be set longer in an on state. Accordingly, frequency of refresh operation can be reduced, which leads to an effect of suppressing power consumption. Further, in the transistor including an i-type or substantially i-type oxide semiconductor layer, a potential applied to the liquid crystal element can be held even when a storage capacitor is not provided.

The field-effect mobility of the transistor including the oxide semiconductor layer can be relatively high, whereby high-speed operation is possible. Therefore, by using the transistor in a pixel portion of a liquid crystal display device, a high-quality image can be provided. In addition, since the transistors can be separately provided in a driver circuit portion and a pixel portion over one substrate, the number of components of the liquid crystal display device can be reduced.

For the liquid crystal display device, a liquid crystal element of a twisted nematic (TN) mode, an in-plane-switching (IPS) mode, a fringe field switching (FFS) mode, an axially symmetric aligned micro-cell (ASM) mode, an optical compensated birefringence (OCB) mode, a ferroelectric liquid crystal (FLC) mode, an antiferroelectric liquid crystal (AFLC) mode, or the like can be used.

Further, a normally black liquid crystal display device such as a transmissive liquid crystal display device utilizing a vertical alignment (VA) mode may also be used. Here, the vertical alignment mode is a method of controlling alignment of liquid crystal molecules of a liquid crystal display panel, in which liquid crystal molecules are aligned vertically to a panel surface when no voltage is applied. Some examples are given as the vertical alignment mode. For example, a multi-domain vertical alignment (MVA) mode, a patterned vertical alignment (PVA) mode, an advanced super-view (ASV) mode, and the like can be used. Moreover, it is possible to use a method called domain multiplication or multi-domain design, in which a pixel is divided into some regions (subpixels) and molecules are aligned in different directions in their respective regions.

In the liquid crystal display device, a black matrix (a light-blocking layer); an optical member (an optical substrate) such as a polarizing member, a retardation member, or an anti-reflection member; and the like are provided as appropriate. For example, circular polarization may be obtained by using a polarizing substrate and a retardation substrate. In addition, a backlight, a side light, or the like may be used as a light source.

In addition, it is possible to employ a time-division display method (also called a field-sequential driving method) with the use of a plurality of light-emitting diodes (LEDs) as a backlight. By employing a field-sequential driving method, color display can be performed without using a color filter.

As a display method in the pixel portion, a progressive method, an interlace method or the like can be employed. Further, color elements controlled in a pixel at the time of color display are not limited to three colors: R, G, and B (R, G, and B correspond to red, green, and blue, respectively). For example, R, G, B, and W (W corresponds to white); or R, G, B, and one or more of yellow, cyan, magenta, and the like can be used. Further, the sizes of display regions may be different between respective dots of color elements. However, one embodiment of the present invention is not limited to a liquid crystal display device for color display and can be applied to a liquid crystal display device for monochrome display.

In FIGS. 11A and 11B, a flexible substrate as well as a glass substrate can be used as any of the first substrate 4001 and the second substrate 4006. For example, a light-transmitting plastic substrate or the like can be used. As plastic, a fiberglass-reinforced plastics (FRP) plate, a polyvinyl fluoride (PVF) film, a polyester film, or an acrylic resin film can be used. In addition, a sheet with a structure in which an aluminum foil is sandwiched between PVF films or polyester films can be used.

The first electrode and the second electrode (each of which may be called a pixel electrode, a common electrode, an opposite electrode, or the like) for applying voltage to the display element may have light-transmitting properties or light-reflecting properties, which depends on the direction in which light is extracted, the position where the electrode is provided, and the pattern structure of the electrode.

Any of the first electrode 4030 and the second electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium zinc oxide, or indium tin oxide to which silicon oxide is added.

One of the first electrode 4030 and the second electrode 4031 can be formed using one or plural kinds of materials selected from metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag); alloys of these metals; and nitrides of these metals.

A conductive composition including a conductive high molecule (also referred to as a conductive polymer) can be used for the first electrode 4030 and the second electrode 4031. As the conductive high molecule, a so-called π-electron conjugated conductive high molecule can be used. For example, polyaniline or a derivative thereof, polypyrrole or a derivative thereof, polythiophene or a derivative thereof, and a copolymer of two or more of aniline, pyrrole, and thiophene or a derivative thereof can be given.

Further, since a transistor is easily broken by static electricity or the like, a protection circuit is preferably provided. The protection circuit is preferably formed using a non-linear element.

This embodiment can be freely combined with any of the other embodiments.

Embodiment 4

In this embodiment, examples of electronic appliances each including the display device described in the above embodiment will be described.

Figure 12A:
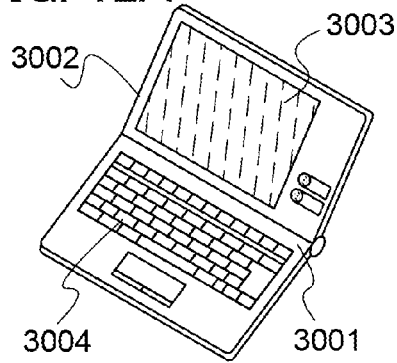
FIGS. 12A to 12F are each a diagram describing one example of an electronic appliance.

FIG. 12A illustrates a laptop personal computer, which includes a main body 3001, a housing 3002, a display portion 3003, a keyboard 3004, and the like. By using the display device described in the above embodiment, a highly reliable laptop personal computer can be obtained.

Figure 12B:
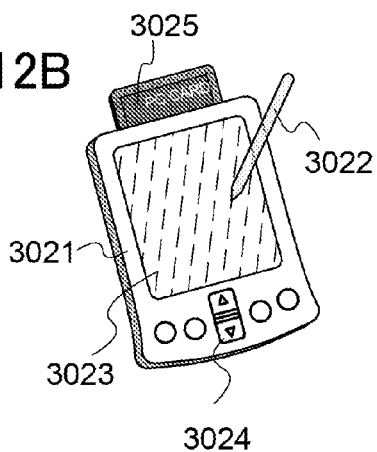

FIG. 12B is a personal digital assistant (PDA), which includes a main body 3021 provided with a display portion 3023, an external interface 3025, operation buttons 3024, and the like. A stylus 3022 is included as an accessory for operation. By using the display device described in the above embodiment, a highly reliable personal digital assistant (PDA) can be obtained.

Figure 12C:
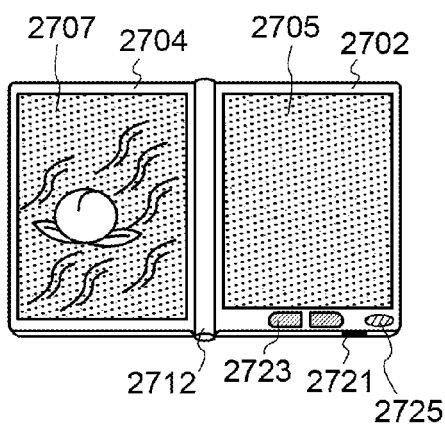

FIG. 12C illustrates an example of an e-book reader. For example, the e-book reader includes two housings, a housing 2702 and a housing 2704. The housing 2702 is combined with the housing 2704 by a hinge 2712, so that the e-book reader can be opened and closed using the hinge 2712 as an axis. With such a structure, the e-book reader can operate like a paper book.

A display portion 2705 and a display portion 2707 are incorporated in the housing 2702 and the housing 2704, respectively. The display portion 2705 and the display portion 2707 may display a continuous image or different images. In the structure where different images are displayed on different display portions; for example, the right display portion (the display portion 2705 in FIG. 12C) displays text and the left display portion (the display portion 2707 in FIG. 12C) displays images. By using the display device described in the above embodiment, a highly reliable e-book reader can be obtained.

FIG. 12C illustrates an example in which the housing 2702 is provided with an operation portion and the like. For example, the housing 2702 is provided with a power supply terminal 2721, operation keys 2723, a speaker 2725, and the like. With the operation keys 2723, pages can be turned. Note that a keyboard, a pointing device, or the like may also be provided on the surface of the housing, on which the display portion is provided. Furthermore, an external connection terminal (an earphone terminal, a USB terminal, or the like), a recording medium insertion portion, and the like may be provided on the back surface or the side surface of the housing. Further, the e-book reader may have a function of an electronic dictionary.

The e-book reader may transmit and receive data wirelessly. Through wireless communication, desired book data or the like can be purchased and downloaded from an e-book server.

Figure 12D:
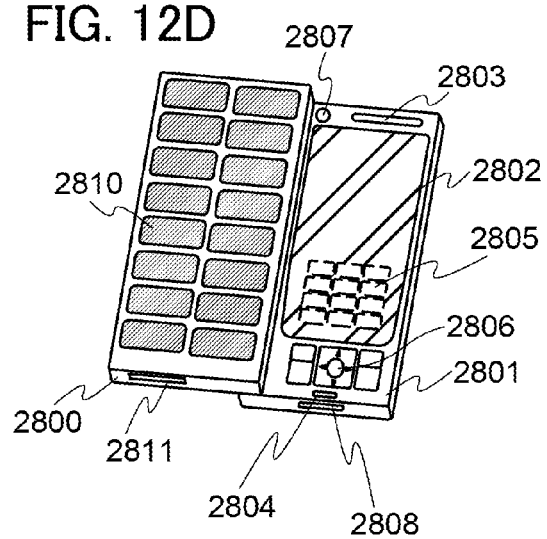

FIG. 12D illustrates a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. In addition, the housing 2800 includes a solar cell 2810 having a function of charge of the mobile phone, an external memory slot 2811, and the like. Further, an antenna is incorporated in the housing 2801.

The display panel 2802 is provided with a touch screen. A plurality of operation keys 2805 which is displayed as images is illustrated by dashed lines in FIG. 12D. Note that a boosting circuit by which a voltage output from the solar cell 2810 is increased to be sufficiently high for each circuit is also included.

In the display panel 2802, the display direction can be changed as appropriate depending on a usage pattern. Further, the mobile phone is provided with the camera lens 2807 on the same surface as the display panel 2802, and thus it can be used as a video phone. The speaker 2803 and the microphone 2804 can be used for videophone calls, recording and playing sound, and the like as well as voice calls. Moreover, the housings 2800 and 2801 in a state where they are developed as illustrated in FIG. 12D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved.

Further, in addition to the above functions, an infrared communication function, a television reception function, or the like may be provided. By using the display device described in the above embodiment, a highly reliable mobile phone can be obtained.

Figure 12E:
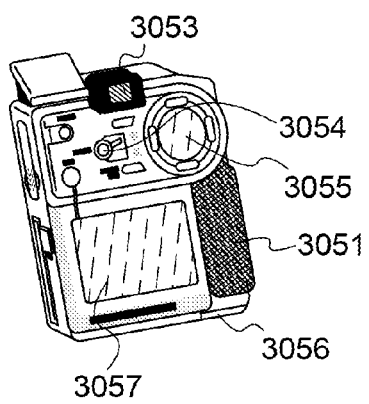

FIG. 12E illustrates a digital video camera, which includes a main body 3051, a display portion A 3057, an eyepiece 3053, an operation switch 3054, a display portion B 3055, a battery 3056, and the like. By using the display device described in the above embodiment, a highly reliable digital video camera can be obtained.

Figure 12F:
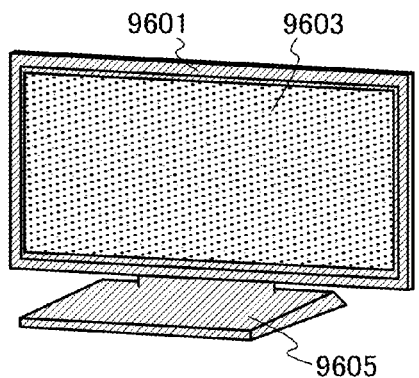

FIG. 12F illustrates an example of a television set. In the television set, a display portion 9603 is incorporated in a housing 9601. The display portion 9603 can display images. Here, the housing 9601 is supported by a stand 9605. By using the display device described in the above embodiment, a highly reliable television set can be obtained.

The television set can operate by an operation switch of the housing 9601 or a separate remote controller. Further, the remote controller may be provided with a display portion for displaying data output from the remote controller.

Note that the television set is provided with a receiver, a modem, and the like. With the use of the receiver, general television broadcasting can be received. Moreover, when the television set is connected to a communication network with or without wires via the modem, one-way (from a sender to a receiver) or two-way (between a sender and a receiver or between receivers) information communication can be performed.

This embodiment can be implemented in appropriate combination with any of the structures described in the other embodiments.

This application is based on Japanese Patent Application Serial No. 2010-275919 filed with Japan Patent Office on Dec. 10, 2010, the entire contents of which are hereby incorporated by reference.

What is claimed is:

1. A method for manufacturing a display device comprising the steps of:
   forming a conductive layer, a first insulating layer, a semiconductor layer, and a second insulating layer;
   forming a gate electrode and an island-like semiconductor layer by selective removal of the conductive layer, the first insulating layer, the semiconductor layer, and the second insulating layer through a first photolithography step;

exposing a portion of the island-like semiconductor layer by selective removal of a portion of the second insulating layer through a second photolithography step;

forming a source electrode and a drain electrode through a third photolithography step; and forming a pixel electrode through a fourth photolithography step.

2. The method for manufacturing the display device, according to claim 1, wherein the conductive layer, the first insulating layer, the semiconductor layer, and the second insulating layer are formed without exposure to the air.

3. The method for manufacturing the display device, according to claim 1, wherein an oxide semiconductor is used for the semiconductor layer.

4. The method for manufacturing the display device, according to claim 1, wherein the gate electrode, the source electrode, or the drain electrode comprises a material containing copper.

5. The method for manufacturing the display device, according to claim 1, wherein a maximum process temperature after the gate electrode, the source electrode, or the drain electrode is formed is lower than or equal to 450° C.

6. A method for manufacturing a display device comprising the steps of:

forming a conductive layer, a first insulating layer, a semiconductor layer, and a second insulating layer;

forming a gate electrode, a capacitor wiring, and an island-like semiconductor layer by selective removal of the conductive layer, the first insulating layer, the semiconductor layer, and the second insulating layer through a first photolithography step;

forming a third insulating layer covering the gate electrode, the capacitor wiring, and the island-like semiconductor layer;

exposing a portion of the island-like semiconductor layer by selective removal of a portion of the second insulating layer and the third insulating layer through a second photolithography step;

forming a source electrode and a drain electrode through a third photolithography step; and forming a pixel electrode through a fourth photolithography step, wherein a portion of the drain electrode overlaps with the third insulating layer and the capacitor wiring.

7. The method for manufacturing the display device, according to claim 6, wherein the conductive layer, the first insulating layer, the semiconductor layer, and the second insulating layer are formed without exposure to the air.

8. The method for manufacturing the display device, according to claim 6, wherein an oxide semiconductor is used for the semiconductor layer.

9. The method for manufacturing the display device, according to claim 6, wherein the gate electrode, the source electrode, or the drain electrode comprises a material containing copper.

10. The method for manufacturing the display device, according to claim 6, wherein a maximum process temperature after the gate electrode, the source electrode, or the drain electrode is formed is lower than or equal to 450° C.

* * * * *